United States Patent
Hamer

(10) Patent No.: US 9,142,595 B2
(45) Date of Patent: Sep. 22, 2015

(54) COLOR-TUNABLE OLED LIGHTING DEVICE

(71) Applicant: OLEDWORKS LLC, Rochester, NY (US)

(72) Inventor: John W. Hamer, Rochester, NY (US)

(73) Assignee: OLEDWORKS LLC, Rochester, NY (US)

( * ) Notice: Subject to any disclaimer, the term of this patent is extended or adjusted under 35 U.S.C. 154(b) by 0 days.

(21) Appl. No.: 14/056,943

(22) Filed: Oct. 18, 2013

(65) Prior Publication Data

US 2015/0108917 A1 Apr. 23, 2015

(51) Int. Cl.
H01L 51/52 (2006.01)
H01L 27/32 (2006.01)
H05B 33/08 (2006.01)
H01L 51/50 (2006.01)

(52) U.S. Cl.
CPC ........ H01L 27/3209 (2013.01); H01L 51/5004 (2013.01); H01L 51/5278 (2013.01); H05B 33/0896 (2013.01)

(58) Field of Classification Search
USPC .......................................................... 257/40
See application file for complete search history.

(56) References Cited

U.S. PATENT DOCUMENTS

| 5,917,280 | A * | 6/1999 | Burrows et al. ............... 313/506 |
| 6,188,175 | B1 * | 2/2001 | May et al. ...................... 313/504 |
| 6,998,789 | B2 * | 2/2006 | Uchida ........................ 315/169.2 |
| 2009/0009101 | A1 * | 1/2009 | Kang et al. ..................... 315/250 |
| 2013/0228769 | A1 * | 9/2013 | Zhou et al. ...................... 257/40 |
| 2014/0084269 | A1 * | 3/2014 | Weaver et al. .................. 257/40 |

* cited by examiner

*Primary Examiner* — Matthew W Such
*Assistant Examiner* — Ali Naraghi
(74) *Attorney, Agent, or Firm* — Rossi, Kimms & McDowell LLP

(57) ABSTRACT

A color-tunable OLED device comprising: a charge-carrying cathode layer and a charge-carrying anode layer disposed parallel to each other; at least a first organic light-emitting unit and a second organic light-emitting unit disposed between the cathode and anode; and at least one charge-generating layer disposed between the cathode and anode, wherein the charge-generating layer is a charge-carrying layer of lesser lateral conductivity than the anode and cathode, and said charge-generating layer is electrically connected without additional circuit elements to another charge-carrying layer and disposed such that at least one organic light-emitting unit is wedged between two directly-connected charge-carrying layers, and at least one organic light-emitting unit is not thusly wedged.

26 Claims, 23 Drawing Sheets

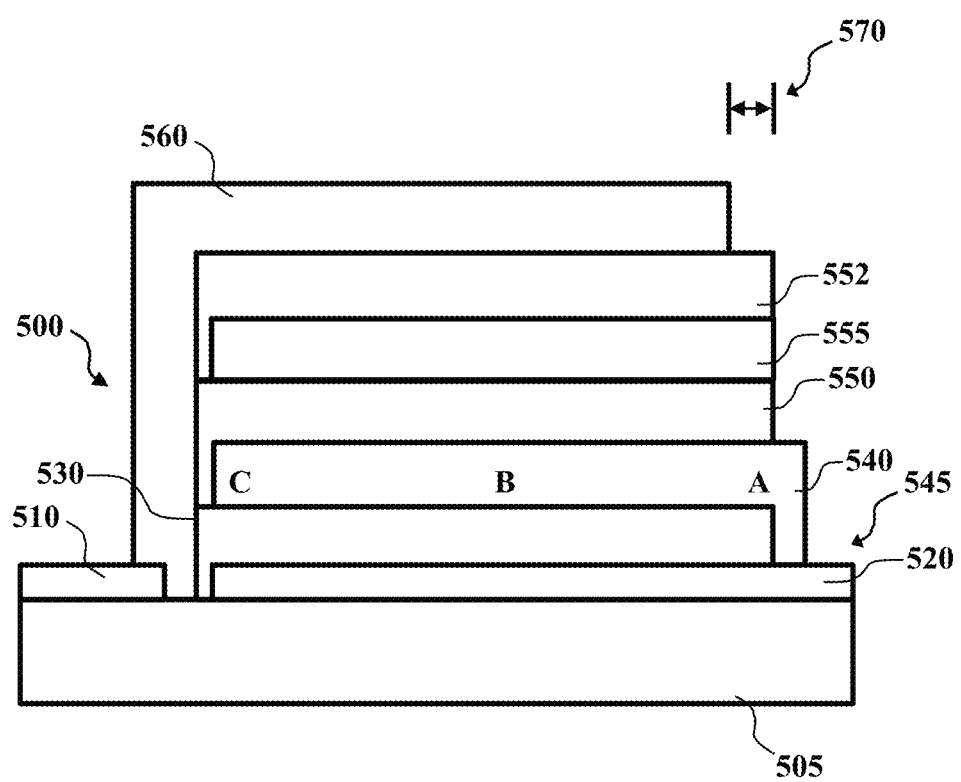

COLOR-TUNABLE OLED LIGHTING DEVICE

FIELD

This disclosure relates to the field of organic light-emitting devices (OLEDs) and their use for lighting, and in particular to an OLED lighting apparatus and method for use of such apparatus. More specifically, this disclosure relates to a color tunable OLED, and methods for using the same.

BACKGROUND

The field of OLED devices has drawn much attention in recent years. Such devices promise that OLEDs can be used for clear and vibrant displays, e.g. in televisions, smartphones, and other display-centric devices. Another area in which OLEDs hold promise is in the area of lighting. OLED panels could be used to replace large area lighting, e.g. overhead lighting. Advantages of such OLED lighting is that the panels can produce light with relatively low power requirements and little heat as a by-product, reducing electricity usage. Such panels also have the possibility of long lifetimes, reducing the need to replace the lamps at regular intervals. OLED lighting can also be made adjustable so that the lighting level can varied depending upon need.

SUMMARY OF VARIOUS EMBODIMENTS

The present teachings provide apparatus for a color-tunable OLED lighting device, and methods for using the same. The particular features of the color-tunable OLED lighting device will become apparent through this disclosure. The apparatus shows an advantage in that it can vary the ratio of light produced by at least two different OLED units of different-color light emission without the requirement some previous devices have had of a third independently controllable layer, and its necessary circuitry, in addition to the normal OLED requirements of an anode and a cathode. For example, Kang et al., in Patent Application Publication US 2009/0009101 A1, published Jan. 8, 2009, disclose a device wherein different stacked light-emitting units can be controlled independently by the use of one or more intermediate layers that are part of the circuitry. While this allows control of the relative amounts of light emitted by the different units, the additional intermediate conductive layers add to the need for additional outside connections, additional circuit complexity, and additional cost. Instead, the present invention allows color control of two different stacked units by controlling the anode and cathode voltage. Such an arrangement means that the circuitry of an individual emitting device can be simplified. In addition, the emitting devices can be arranged in a series circuit and still maintain the simplified circuitry arrangement.

In its basic embodiment, the color-tunable OLED lighting device of the present disclosure is a layered structure that includes a charge-carrying cathode layer and a charge-carrying anode layer that are disposed in an arrangement parallel to each other. The lighting device further includes at least two organic light-emitting units disposed between the cathode and anode. The lighting device further includes at least one charge-generating layer disposed between the cathode and anode. The charge-generating layer is a charge-carrying layer that has lesser lateral conductivity than the anode and cathode. The charge-generating layer of this invention is electrically connected without additional circuit elements to another charge-carrying layer, which depending upon the particular embodiment can be the anode, the cathode, or even a second charge-generating layer. The charge-generating layer and its connected charge-carrying layer are disposed in such a way as to cause at least one of the organic light-emitting units to be "wedged" between the two charge-carrying layers, and at least one of the organic light-emitting units to be not thusly wedged. For the purposes of this disclosure, the term "wedged" is used only to denote the arrangement of an organic light emitting unit disposed between two directly connected charge-carrying layers and does not imply any unusual pressure or physical force upon or inside the lighting device, in either manufacture or use thereof. The arrangement of at least one wedged organic light-emitting unit and at least one non-wedged organic light-emitting unit allows one to vary the ratio of light emitted by the two units simply by varying the voltage or potential between the anode and cathode. For the purposes of this disclosure, the term "charge-carrying layer" refers to a layer that has sufficient conductivity that significant quantities of current can be carried laterally in the devices disclosed herein. Such charge-carrying layers include anode layers, cathode layers, and charge-generating layers as disclosed herein. Those skilled in the art will appreciate that many layers well-known in OLED devices, e.g. light-emitting layers, hole-transporting layers, and electron-transporting layers, transport current vertically in such devices, but do not transport significant quantities of current in the lateral direction, and are not included in the term "charge-carrying layer". The various embodiments, variations, and examples to be described herein will make the basic embodiment clear.

In a variety of embodiments, this disclosure provides for a color-tunable OLED lighting device comprising two organic light-emitting units between an anode and a cathode. The two organic light-emitting units each comprise the necessary organic layers to form, with an anode and a cathode, an OLED device. The two organic light-emitting units produce light in two different portions of the visible spectrum, a first portion and a second portion of the visible spectrum. The color-tunable OLED lighting device further comprises a charge-generating layer that is electrically connected to one of the electrodes, thus disposing one of the organic light-emitting units to be wedged between the charge-generating layer and the attached electrode. In some embodiments, this charge-generating layer will be referred to as the first charge-generating layer. The charge-generating layer is selected to have a lower lateral conductivity than the electrodes, but a higher lateral conductivity than the organic light-emitting units. In the various embodiments of this invention, the actual conductivity of the charge-generating layer is matched to the OLED device. The manner in which the OLED lighting device varies in color will depend upon the intrinsic conductivity of the charge-generating layer material, the thickness of the charge-generating layer, the lateral length of the charge-generating layer, the non-linear current-voltage characteristics of the organic light-emitting units, and the potential difference between the anode and cathode. The potential difference between the anode and the cathode can be under the control of the end-user to vary the color of light emitted; the other factors are selected in producing the color-tunable OLED lighting device.

In some embodiments of this invention, the charge-generating layer is electrically connected to the anode. In various other embodiments of this invention, the charge-generating layer is electrically connected to the cathode. In various embodiments, the contact between the electrode and the charge-generating layer can be limited to certain regions of the perimeter of the emitting area, or can include more regions up to substantially all of the perimeter. For example, given a rectangular emitting area, the electrode/charge-generating layer contact can be on one, two, three, or all four sides of the emitting area, or portions thereof. In a variety of embodiments, the charge-generating layer comprises a metal, such as silver or calcium, or a metal alloy that is sufficiently thin that it is substantially transparent. In various other embodiments, the charge-generating layer comprises an organic or inorganic transparent conductor or semiconductor, or a mixture of such a transparent conductor or semiconductor with a metal or metal alloy.

In a variety of embodiments of this invention, the charge-generating layer is electrically connected to the electrode at the edge of an emitting area of the device. In various other embodiments of this invention, the connection between the charge-generating layer and the electrode is offset a selected distance outside an emitting area of the device.

In a variety of embodiments of this invention, the different portions of the visible spectrum wherein the organic light-emitting units produce light are different colors which can be complementary colors. In some embodiments of this invention, one of the organic light-emitting units can produce light of a blue color and another organic light-emitting unit can produce light of a yellow or orange color, wherein the emission from the two units can together form light that will be perceived by a viewer as white light. In other embodiments, one organic light-emitting unit can produce a warm or yellowish white light, while another organic light-emitting unit can produce blue light or bluish white light. To the extent that the relative ratios of light produced by the different units are varied, a viewer can perceive white light, but of a variable color temperature.

In a variety of embodiments of this invention, one or more of the light-emitting units can further comprise a second charge-generating layer and a third organic light-emitting unit. The second charge-generating layer can have the same or a different conductivity as the first charge-generating layer. In some embodiments, the second charge-generating layer can be unconnected to an electrode. In various other embodiments, the second charge-generating layer can be connected to a second electrode, while the first charge-generating layer is connected to a first electrode. For example, the first charge-generating layer can be connected to the anode while the second charge-generating layer can be connected to the cathode. The number of wedged and non-wedged organic light-emitting units will depend upon the particular device structure, but will always include at least one wedged and at least one non-wedged organic light-emitting units.

In a variety of embodiments, this disclosure provides for a color-tunable OLED lighting device comprising a first organic light-emitting unit, a first charge-generating layer, a second organic light-emitting unit, a second charge-generating layer, and a third organic light-emitting unit, between an anode and a cathode, wherein the two charge-generating layers are electrically connected and one of the organic light-emitting units is wedged between the two charge-generating layers. The second charge-generating layer can have the same or a different conductivity as the first charge-generating layer. The three organic light-emitting units produce light in at least two different portions of the visible spectrum, a first portion and a second portion of the visible spectrum. In some embodiments, the three organic light-emitting units produce light in three different portions of the visible spectrum. The charge-generating layers are selected to have a lower lateral conductivity than the electrodes, but a higher lateral conductivity than the organic light-emitting units. In the various embodiments of this invention, the actual conductivity of the charge-generating layers is matched to the OLED device. The manner in which the OLED lighting device varies in color will depend upon the intrinsic conductivity of the charge-generating layer material, the thickness of the charge-generating layers, the lateral length of the charge-generating layers, the non-linear current-voltage characteristics of the organic light-emitting units, and the potential difference between the anode and cathode. The potential difference between the anode and the cathode can be under the control of the end-user to vary the color of light emitted; the other factors are selected in producing the color-tunable OLED lighting device.

In some embodiments comprising three organic light-emitting units and two charge-generating layers, the two charge-generating layers can be connected to an electrode as well as to each other. In some embodiments, the charge-generating layers can be connected to the anode. In other embodiments, the charge-generating layers can be connected to the cathode. In such embodiments, two organic light-emitting units are wedged organic light-emitting units, and one organic light-emitting unit is not wedged.

In some embodiments of this invention, a plurality of color-tunable OLED lighting devices can be connected together in a series circuit, wherein the anode of one device is directly connected to the cathode of another device. Such embodiments are color-tunable in the same manner as single color-tunable OLED lighting devices of this invention.

In the various embodiments of this invention, the actual voltage of the charge-generating layer at any given point will determine the ratio of light-emission from a given color-tunable OLED lighting device. In a variety of embodiments, the control circuitry thus includes a voltage control for adjusting the relative potential difference between the two electrodes. In various embodiments of this invention, the control circuitry further includes a duty-cycle control, such as a pulse-width modulating device, which serves under some circumstances to vary the duty cycle or fraction of time that the color-tunable OLED lighting device emits light, and thereby compensate for brightness changes due to varying the voltage applied to the device. See, for example, Sadwick et al., U.S. Pat. No. 8,405,319, dated Mar. 26, 2013, and references therein for dimmer devices. In some embodiments, a pulse-width modulating device can be directly controlled as part of the adjustment circuitry, such that when the potential is increased between the two electrodes, which would normally lead to greater current and greater light emission, the pulse-width modulating device reduces the length of current pulses so as to keep the lighting level constant. In other embodiments, there can be a measure of independence between the two controls, which can allow the end-user control of both color and brightness of the device.

In a variety of embodiments, this disclosure provides exemplary methods for controlling the color of light emission of a color-tunable OLED device of this invention. According to various embodiments, the method can include the steps of: providing a substrate for the device; providing a first electrode; providing a first organic light-emitting unit that can provide light in a first portion of the visible spectrum; providing a charge-generating layer that is electrically connected to one of the electrodes, e.g. the first electrode; providing a second organic light-emitting unit that can provide light in a second portion of the visible spectrum; providing a second electrode; and varying the potential between the two electrodes. According to various other embodiments, the method can include the steps of: providing a substrate for the device; providing a first electrode; providing a first organic light-emitting unit that can provide light in a first portion of the visible spectrum; providing a first charge-generating layer;

providing a second organic light-emitting unit that can provide light in a second portion of the visible spectrum; providing a second charge-generating layer that is electrically connected to the first charge-generating layer; providing a third organic light-emitting unit; providing a second electrode; and varying the potential between the two electrodes.

ADVANTAGES

It is an advantage of this invention that it can provide a color-tunable OLED lighting device that requires simple external circuitry to light it and to control the color of the light. It is a further advantage that the color-tunable OLED lighting devices can be connected in a series circuit with the same simple external control circuitry. This has the further advantage of simplifying manufacturing steps and reducing manufacturing costs.

BRIEF DESCRIPTION OF THE DRAWINGS

These and other embodiments of the disclosure will be discussed with reference to the following exemplary and non-limiting illustrations, in which like elements are numbered similarly, the illustrations are scaled for ease of visualization and not necessarily for dimensional accuracy, and where:

FIG. 2a shows a cross-sectional view of another embodiment of a color-tunable OLED lighting device according to this invention;

DESCRIPTION

Figure 1A:
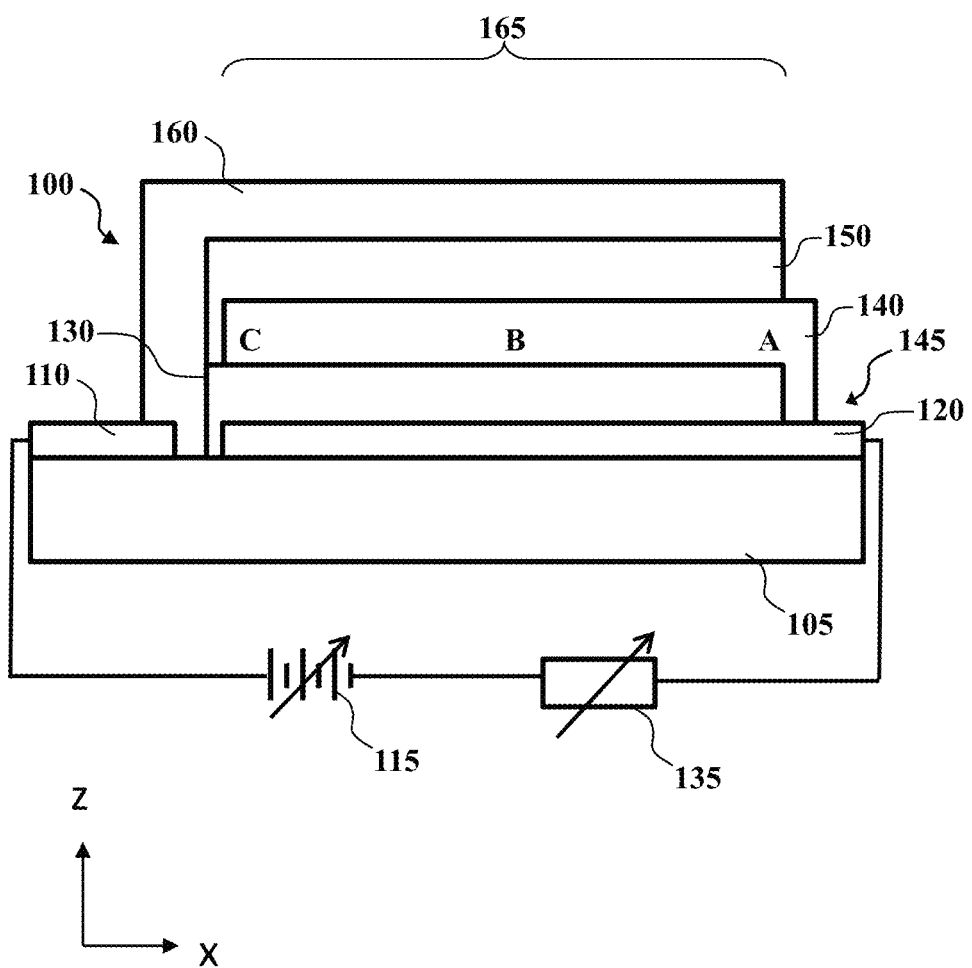
FIG. 1a shows a cross-sectional view of a first embodiment of a color-tunable OLED lighting device according to this invention.

Turning now to FIG. 1a, there is shown a cross-sectional view of a first non-limiting embodiment of a color-tunable OLED lighting device according to this invention. For the purposes of this disclosure, the term "OLED lighting device" refers to a complete device for emitting light of a desired color for a desired purpose, e.g. a device that emits white light for use in a lighting fixture, which can take many forms. A "color-tunable OLED lighting device" refers to such a device that allows an end-user to change the color of light emitted by the device. Color-tunable OLED lighting device 100 is formed on substrate 105. Substrate 105 and other substrates useful in this invention can be an organic solid, an inorganic solid, or a combination of organic and inorganic solids, and can be rigid or flexible. Typical substrate materials include glass, plastic, metal, ceramic, semiconductor, metal oxide, semiconductor oxide, semiconductor nitride, low-temperature polysilicon, amorphous-silicon, or combinations thereof. The substrate can either be light transmissive or opaque, depending on the intended direction of light emission. The light transmissive property is desirable for viewing the light emission through the substrate. Transparent glass or plastic are commonly employed in such cases. For applications where the light emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices. In this embodiment, substrate 105 is provided with a charge-carrying first electrode 120, and an electrode contact 110 for a charge-carrying second electrode 160. For the purposes of this disclosure, first electrode 120 will also be referred to as the anode, and second electrode 160 will also be referred to as the cathode. It will be understood by those skilled in the art that an inverted OLED architecture can be used in this invention; that is, first electrode 120 can be a cathode while second electrode 160 can be an anode.

When light emission is viewed through the anode and substrate, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, zinc oxide, aluminum- or indium-doped zinc oxide, magnesium-indium oxide, molybdenum oxide, and nickel-tungsten oxide. In addition to these oxides, metal nitrides such as gallium nitride, and metal selenides such as zinc selenide, and metal sulfides such as zinc sulfide, are used as the anode. For applications where EL emission is viewed only through the cathode electrode, the transmissive characteristics of the anode are immaterial and any conductive material can be used, regardless if it is transparent, opaque, or reflective. Example conductors for the present invention include, but are not limited to, gold, silver, iridium, molybdenum, palladium, and platinum. Typical anode materials, transmissive or otherwise, have a work function no less than 4.0 eV. Desired anode materials can be deposited by any suitable process such as evaporation, sputtering, chemical vapor deposition, or electrochemical deposition.

If the device is top-emitting, the second electrode must be transparent or nearly transparent. For such applications, metals must be thin (preferably less than 25 nm) or one must use transparent conductive oxides (e.g. indium-tin oxide, indium-zinc oxide), or a combination of these materials. Optically transparent cathodes have been described in more detail in U.S. Pat. No. 5,776,623. If the device is bottom-emitting, that is, where EL emission is viewed only through the anode electrode, the transmissive characteristics of the cathode are immaterial and any conductive material can be used. Example conductors for the present invention include, but are not limited to, gold, silver, iridium, molybdenum, palladium, and platinum.

A first organic light-emitting or OLED unit 130 is located over first electrode 120, and thus between first electrode 120 and second electrode 160. For the purposes of this disclosure, the terms "organic light-emitting unit" and "OLED unit" refer to an OLED device that comprises the necessary materials to form a complete light-emitting unit, except for electrodes, substrates, and encapsulation materials. Organic light-emitting unit 130 can comprise any material useful in an OLED device, as well-known in the art, other than the anode or cathode layers. Organic light-emitting unit 130 can thus comprise multiple layers, including materials useful in hole-injecting layers (HIL), hole-transporting layers (HTL), light-emitting layers (LEL), electron-transporting layers (ETL), or electron-injecting layers (EIL). Such organic materials are well-known in the art; see for example U.S. Pat. No. 7,564,182 by Boroson et al., and references therein. The organic material layers can each individually comprise a single material or can be a mixture of materials useful to the function of the particular layer. The properties of first organic light-emitting unit 130, and other organic light-emitting units to be disclosed as part of this invention, are such that the organic light-emitting units have non-linear current-voltage relationships; that is, they function as semiconductors. This is a well-known property of organic light-emitting diodes, or OLEDs. For the purposes of this disclosure, a color-tunable OLED lighting device includes at least two OLED units, as will be disclosed.

A charge-generating layer (CGL) 140 is located over OLED unit 130. In some embodiments to be further disclosed, this charge-generating layer will be referred to as the first charge-generating layer. Charge generating layer 140 is a charge-carrying layer that is electrically connected to a charge-carrying layer, e.g. one of the electrodes, without additional circuit elements, such as transistors, controllers, etc. In this embodiment, charge generating layer 140 is electrically connected to first electrode 120 at electrode/CGL junction 145. Electrode/CGL junction 145 is shown along one edge of first organic light-emitting unit 130 (and thus along one side of the light-emitting area). However, the electrode/CGL junction can in other embodiments be along two or more edges of the organic light-emitting unit. By connecting the charge-generating layer to one of the electrodes, one of the organic light-emitting units (e.g. organic light-emitting unit 130 in this embodiment) is thus disposed or wedged between two electrically connected charge-carrying layers, that is, the charge-generating layer and the connected electrode. An organic light-emitting unit so disposed can also be referred to as a wedged organic light-emitting unit or a wedged OLED unit.

The lateral conductivity of charge-generating layer 140 is selected to be greater than that of the organic light-emitting units, that is, the lateral resistivity of charge-generating layer 140 is less than that of the organic light-emitting units. The terms "resistivity" and "lateral resistivity" of a thin layer are synonymous and are used as commonly known in the art and measured in ohms/square, or simply ohms. The terms "conductivity" and "lateral conductivity" of a thin layer are synonymous and refer to the inverse of the resistivity. The lateral conductivity of charge-generating layer 140 is selected to be less than that of the electrodes, that is, the lateral resistivity of charge-generating layer 140 is greater than that of the electrodes. For example, the resistivity of a charge-generating layer can be on the order of 100 to 3000 ohms/square, while that of an indium-tin-oxide electrode can be on the order of 50 ohms/square. The lateral conductivity of charge-generating layer 140 is selected such that it will conduct substantially all the current for color-tunable OLED light-emitting device 100 at low voltage, but cannot carry a significant fraction of current at higher voltage. This is partially dependent upon the characteristics of the light-emitting units and will be disclosed in further detail below. The charge-generating layer can be in a stacked form comprising an intermediate cathode electrode layer and an intermediate anode electrode layer, or in a form comprising a single conductive layer. Charge-generating layer 140, and all embodiments of charge-generating layers of this disclosure, must also be sufficiently transparent to allow light to pass through such that color-tunable OLED lighting device 100 can properly function. For example, if color-tunable OLED lighting device 100 is a top-emitting device, the light emitted by first light-emitting unit 130 must pass through charge-generating layer 140. The charge-generating layer must further be able to be deposited by a method that does not damage the underlying organic light-emitting unit and which can deposit the charge-generating layer in a sufficiently even manner. Charge-generating layer 140 can be a layer of a moderately conductive metal or metal alloy that is sufficiently thin that it is substantially transparent. Alternatively, charge-generating layer 140 can comprise an organic or inorganic transparent conductor or semiconductor, or a mixture of such a transparent conductor or semiconductor with a metal or metal alloy. Charge-generating layer 140 can comprise a metal oxide. Usefully, charge-generating layer 140 has a low work function. Some non-limiting examples of materials for charge-generating layer 140 include Ca, Mg, Ag, Ca/Ag alloy, Mg/Ag alloy, Ca/IZO, ITO, molybdenum oxide, and Ag/IZO.

A second organic light-emitting or OLED unit 150 is located between first electrode 120 and second electrode 160 and over organic light-emitting unit 130 and charge-generating layer 140. Second OLED unit 150 can comprise the various layers disclosed for first OLED unit 130. For the purposes of this invention, it is desirable that first OLED unit 130 and second OLED unit 150 produce different-colored light. That is, first organic light-emitting unit 130 can provide light in a selected first portion of the visible spectrum, and second organic light-emitting unit 150 can provide light in a selected second portion of the visible spectrum. The colors emitted by the two light-emitting units can be of any color, and those skilled in the art can conceive of many potential light-emitting units. However, for the purposes of functioning as a lighting device, it can be useful that the selected first portion of the visible spectrum and the selected second portion of the visible spectrum be complementary colors that together can produce white light. For example, first OLED unit 130 can be a blue-emitting OLED unit, while second OLED unit 150 can be a red- or yellow-emitting unit. In another example, first OLED unit 130 can be a bluish-white-emitting OLED unit, while second OLED unit 150 can be a yellowish-white-emitting unit. By varying the relative portions of light in the first and second portions of the visible spectrum as disclosed herein, one can produce white light or light that is yellower (also known as warmer) or bluer (also known as colder) than white light. It can be seen that second OLED unit 150 comprises OLED structure known in the art, by which we mean that OLED unit 150 is not wedged between two electrically connected charge-carrying layers.

A second electrode 160 is located over second OLED unit 150, and is electrically connected to electrode contact 110. The emitting area of devices of this disclosure is the area of overlap between the various conductive layers, including electrodes 120 and 160, and charge-generating layer 140. Thus, color-tunable OLED lighting device 100 has emitting area 165. Electrode contact 110 and first electrode 120 can be connected to an external source of current, thus forming an electrical circuit between electrodes 120 and 160, which can cause emission of light from first organic light-emitting unit 130 and second organic light-emitting unit 150. However, the light emission of these two light-emitting units can be modified by control of the voltage (which also controls the current), depending upon the characteristics (e.g. the conductivity) of charge-generating layer 140 and the non-linear voltage-current characteristics of OLED units 130 and 150. In non-mathematical terms, one may think of it as follows: If the conductivity of charge-generating layer 140 is too great, it will always short the circuit between electrodes 120 and 160, and OLED unit 130 will never emit light. If the conductivity of charge-generating layer 140 is too small, it will not conduct current laterally and substantially the entire current will always flow between electrodes 120 and 160. By selecting the proper conductivity (or inversely, resistivity) of charge-generating layer 140, one can provide that at lower voltages charge-generating layer 140 will largely short the circuit between electrodes 120 and 160, but at higher voltages this effect will be reduced. This will be further disclosed herein.

Color-tunable OLED lighting device 100 is shown connected to a control circuit, which includes at least variable voltage source 115 and can also include pulse-width modulating unit 135, and is connected to electrode 120 and electrode contact 110. Variable voltage source 115 can be any variable voltage DC source as well-known to those skilled in the art. As will be further disclosed, different potential differences from variable voltage source 115 can vary the ratio of light emitted by first organic light-emitting unit 130 and second organic light-emitting unit 150. Pulse-width modulating unit 135 can be optionally included in the control circuitry, and can be any pulse-width modulating unit as well-known to those skilled in the art. As well-known in the art, increasing the voltage across first and second organic light-emitting units 130 and 150 will increase the current flow as well, increasing the overall light emitted by the device. Thus, in addition to varying the color, varying the voltage will vary the brightness of the device. Pulse-width modulating unit can shorten or lengthen intermittent pulses of current. For example, as the voltage generated by variable voltage source 115 is increased, the length of intermittent current pulses can be decreased to maintain the same overall brightness level of color-tunable OLED lighting device 100. Variable voltage source 115 and pulse-width modulating unit 135 can be connected in a feedback circuit (not shown) to do this in a manner transparent to the end-user. Alternatively, variable voltage source 115 and pulse-width modulating unit 135 can be connected to a control unit that allows the end-user to independently vary the color and brightness. Those skilled in the art will appreciate that many means of achieving this are known. It will be understood that variable voltage source 115 and pulse-width modulating unit 135 can be used with any of the embodiments disclosed herein.

Figure 1B:
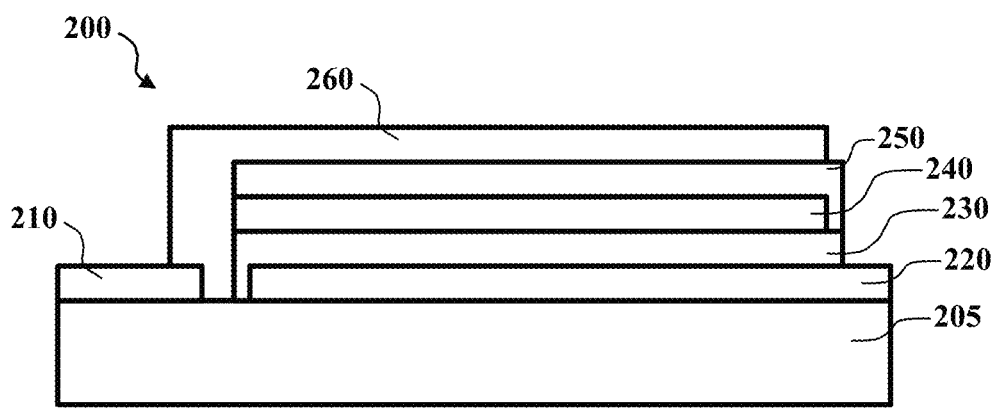
FIG. 1b shows a cross-sectional view of another embodiment of a color-tunable OLED lighting device according to this invention.

Turning now to FIG. 1b, there is shown a cross-sectional view of another embodiment of a color-tunable OLED lighting device according to this invention. Substrate 205, first electrode 220, electrode contact 210, first OLED unit 230, second OLED unit 250 and second electrode 260 of color-tunable OLED lighting device 200 are analogous to substrate 105, first electrode 120, electrode contact 110, first OLED unit 130, second OLED unit 150 and second electrode 160, respectively, of color-tunable OLED lighting device 100. This embodiment also includes a charge-generating layer 240 between OLED units 230 and 250. In this embodiment, charge-generating layer 240 is electrically connected to second electrode 260, thus making second OLED unit 250 a wedged OLED unit and first OLED unit 230 a non-wedged unit. While further examples will show the charge-generating layer electrically connected to the first electrode, it will be understood that this invention can be equally effective with the charge-generating layer electrically connected to the first or the second electrode.

Figure 1C:
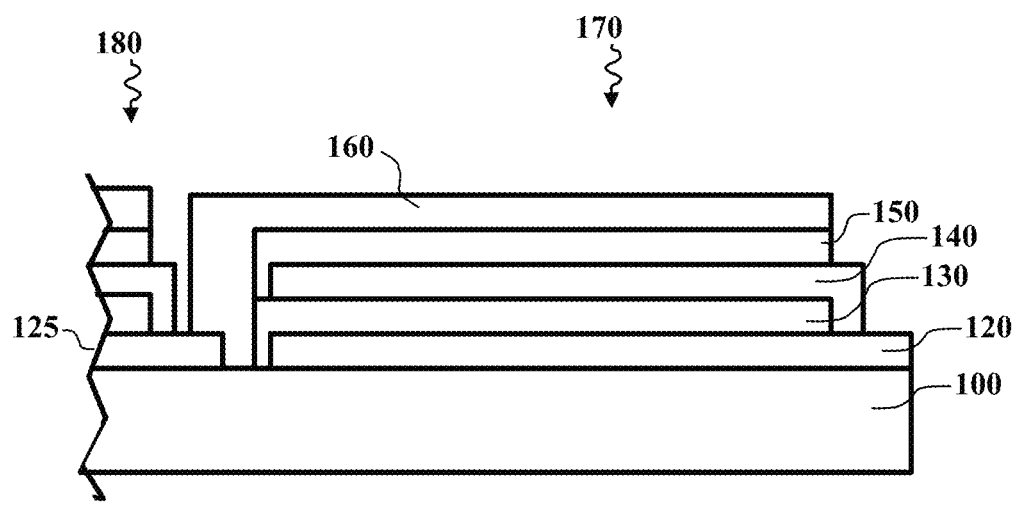
FIG. 1c shows a cross-sectional view of another embodiment of a color-tunable OLED lighting device according to this invention.

Turning now to FIG. 1c, there is shown a portion of a plurality of color-tunable OLED lighting devices connected in series. Color-tunable OLED lighting device 170 and color-tunable OLED lighting device 180 are connected in series. Both color-tunable OLED lighting devices 170 and 180 have the structure of color-tunable OLED lighting device 100, above. Second electrode 160 of color-tunable OLED lighting device 170 is electrically connected to first electrode 125 of color-tunable OLED lighting device 180. Thus, if second electrode 160 is the cathode of color-tunable OLED lighting device 170, first electrode 125 is the anode of color-tunable OLED lighting device 180, and the two devices are connected in series. One or more further color-tunable lighting devices can be electrically connected in series beyond color-tunable OLED lighting device 180 in a like manner. Although not shown, a control circuit such as that shown in FIG. 1a can also be used with the lighting device of FIG. 1c without further complications. That is, the circuit will be simply connected to first electrode 120, and to an electrode contact (analogous to electrode contact 110 of FIG. 1a) at the other end of the color-tunable OLED lighting device series. Thus, a series device such as that shown in FIG. 1c is amenable to the same simple potential control for varying the voltage as a single device of FIG. 1a or 1b.

Figure 1D:
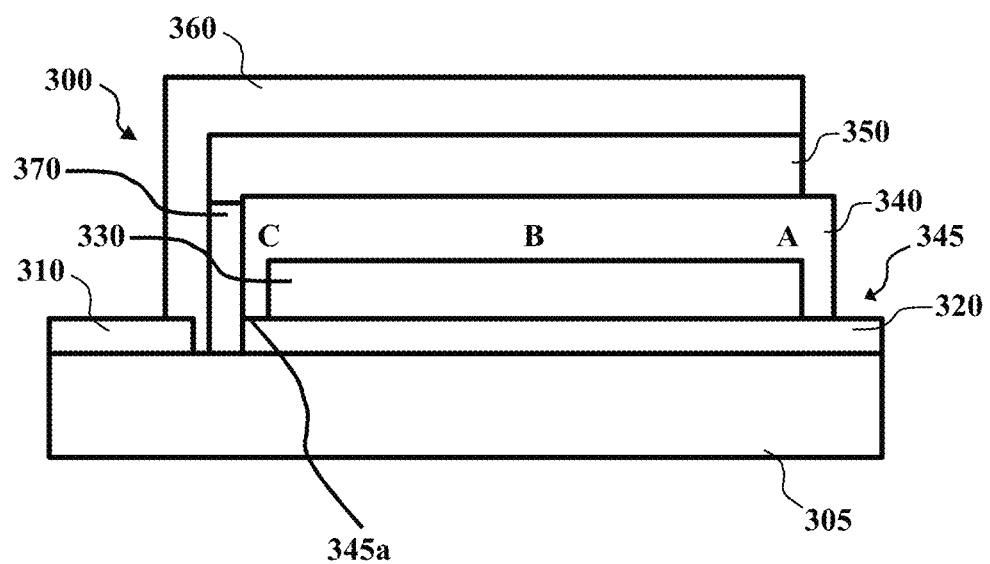
FIG. 1d shows a cross-sectional view of another embodiment of a color-tunable OLED lighting device according to this invention.

Turning now to FIG. 1d, there is shown a cross-sectional view of another embodiment of a color-tunable OLED lighting device according to this invention. Substrate 305, first electrode 320, electrode contact 310, first OLED unit 330, second OLED unit 350 and second electrode 360 of color-tunable OLED lighting device 300 are analogous to substrate 105, first electrode 120, electrode contact 110, first OLED unit 130, second OLED unit 150 and second electrode 160, respectively, of color-tunable OLED lighting device 100.

This embodiment also includes a charge-generating layer 340 between OLED units 330 and 350. In this embodiment, first OLED unit 330 can be a rectangular, square, or other-shaped light-emitting unit that is covered by charge-generating layer 340 such that charge-generating layer 340 is electrically connected to first electrode 320 on all sides of the emitting area. OLED unit 330 is thus wedged between charge-generating layer 340 and first electrode 320. Color-tunable OLED lighting device 300 can also include an insulator 370 to prevent shorting between charge-generating layer 340 and second electrode 360. Insulator 370 can comprise second OLED unit 350 or, in embodiments wherein second OLED unit 350 comprises multiple layers, insulator 370 can comprise a selected subset of the layers of second OLED unit 350. Alternatively, insulator 370 can comprise a separate insulating material deposited after charge-generating layer 340 and before second electrode 360. Such an arrangement can be useful for making larger contiguous emitting areas than those that can be provided by the arrangement shown in FIG. 1a.

Figure 1E:
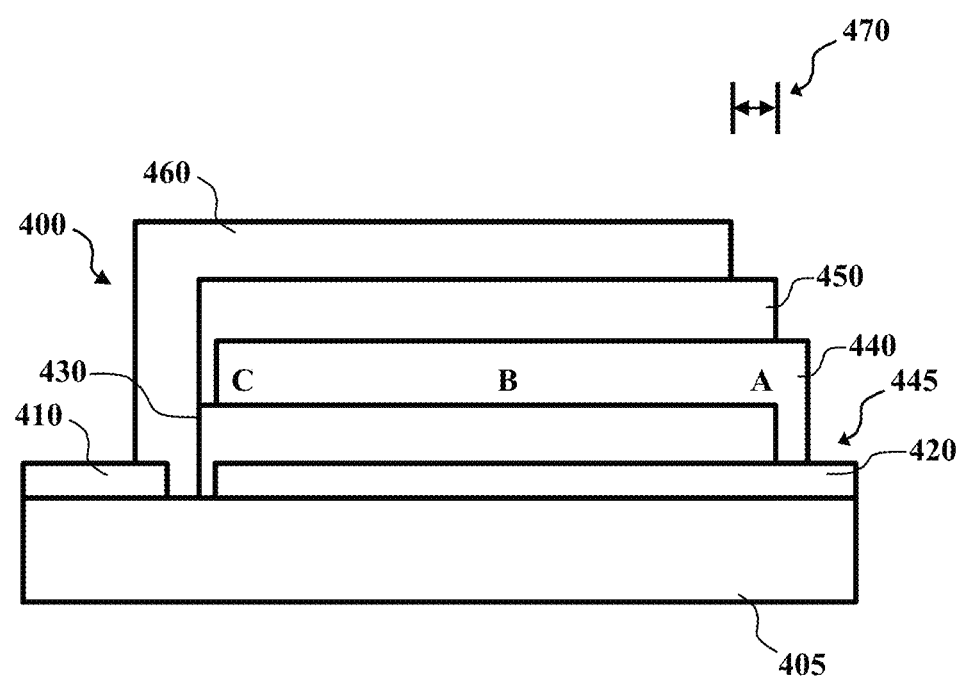
FIG. 1e shows a cross-sectional view of another embodiment of a color-tunable OLED lighting device according to this invention.

One edge of the emitting area of the above color-tunable OLED lighting devices has been located at the CGL/electrode junction, which is the electrical connection of the charge-generating layer to the electrode. Turning now to FIG. 1e, there is shown a cross-sectional view of another embodiment of a color-tunable OLED lighting device according to this invention. Substrate 405, first electrode 420, electrode contact 410, first OLED unit 430, second OLED unit 450 and charge-generating layer 440 of color-tunable OLED lighting device 400 are analogous to substrate 105, first electrode 120, electrode contact 110, first OLED unit 130, second OLED unit 150 and charge-generating layer 140, respectively, of color-tunable OLED lighting device 100. First OLED unit 430 is wedged between charge-generating layer 440 and first electrode 420. In color-tunable OLED lighting device 400, second electrode 460 is structured to not span the width of first and second OLED units 430 and 450, but has its end offset from electrode/CGL junction 445 by a selected distance 470. By such arrangement, the electrical connection of charge-generating layer 440 is located outside of the emitting area of second OLED unit 450. This arrangement prevents current from flowing through second organic light-emitting unit 450 at or immediately adjacent to electrode/CGL junction 445. Usefully, selected offset distance 470 can be from 1% to 20% of the width of charge-generating layer 440. The effect of this offset will be further disclosed below.

Turning now to FIG. 2a, there is shown a cross-sectional view of another embodiment of a color-tunable OLED lighting device according to this invention. Substrate 505, first electrode 520, electrode contact 510, first OLED unit 530, first charge-generating layer 540 attached to first electrode 520, second OLED unit 550, and second electrode 560 of color-tunable OLED lighting device 500 are analogous to substrate 105, first electrode 120, electrode contact 110, first OLED unit 130, charge-generating layer 140 attached to first electrode 120, second OLED unit 150, and second electrode 160, respectively, of color-tunable OLED lighting device 100. The end of second electrode 560 can optionally be offset by a distance 570 from electrode/CGL junction 545, as disclosed for color-tunable OLED lighting device 400, above. Color-tunable OLED lighting device 500 further comprises second charge-generating layer 555 over second organic light-emitting unit 550, and third organic light-emitting unit 552 over second charge-generating layer 555. Light-emitting unit 550 can comprise any materials and layers useful in an OLED device, as disclosed above for organic light-emitting unit 130. Charge-generating layer 555 is a charge-carrying layer that has lateral electrical conductivity and can comprise materials disclosed above for charge-generating layer 140. The lateral conductivity of charge-generating layer 555 is selected to be greater than that of organic light-emitting units 550 and 552, but less than that of electrodes 520 and 560. The lateral conductivity of charge-generating layer 555 can be the same as or different from that of charge-generating layer 540. Second charge-generating layer 555 serves as an intermediate layer and is neither directly connected to first charge-generating layer 540 nor to an electrode. First organic light-emitting unit 530 is a wedged OLED unit as defined for this disclosure, while second and third light-emitting units 550 and 552 are non-wedged.

Figure 2B:
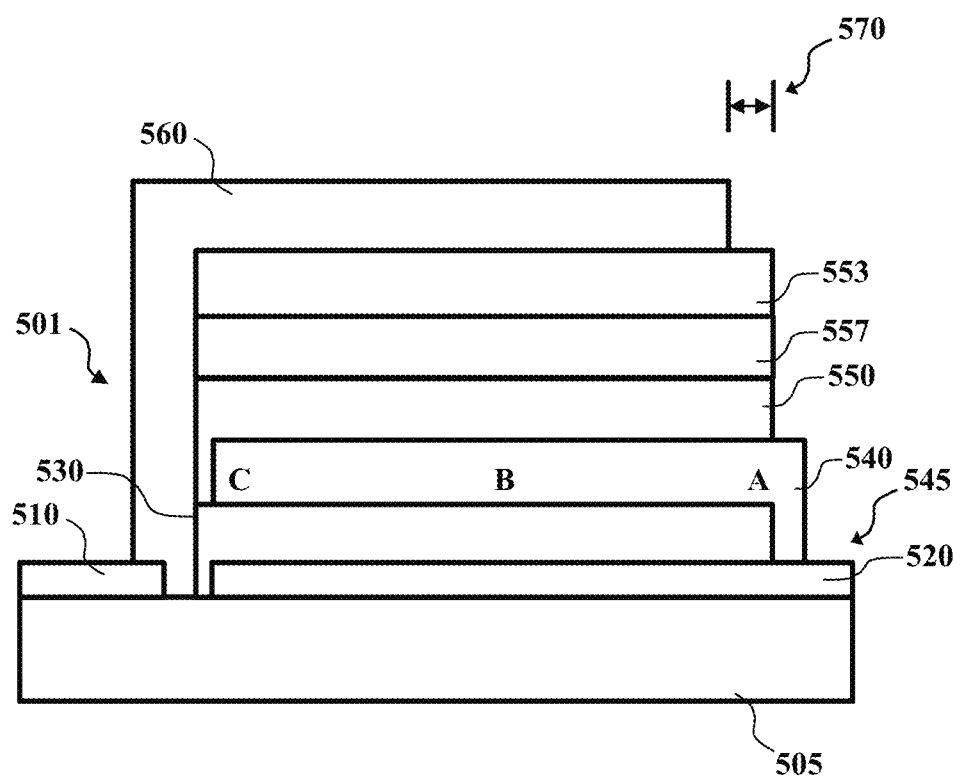
FIG. 2b shows a cross-sectional view of another embodiment of a color-tunable OLED lighting device according to this invention.

Turning now to FIG. 2b, there is shown a cross-sectional view of another embodiment of a color-tunable OLED lighting device according to this invention. In color-tunable OLED lighting device 501, elements numbered identically to color-tunable OLED lighting device 500 of FIG. 2a are substantially the same. However, in color-tunable OLED lighting device 500, second charge-generating layer 557 is electrically connected to second electrode 560. This makes first and third organic light-emitting units 530 and 553 wedged OLED units as defined for this disclosure, while second organic light-emitting unit 550 is a non-wedged unit. The lateral conductivity of charge-generating layer 557 can be the same as or different from that of charge-generating layer 540. Charge-generating layer 557 can cause the emission of organic light-emitting unit 553 to vary similarly to the manner in which charge-generating layer 540 can cause the emission of organic light-emitting unit 530 to vary.

Figure 3A:
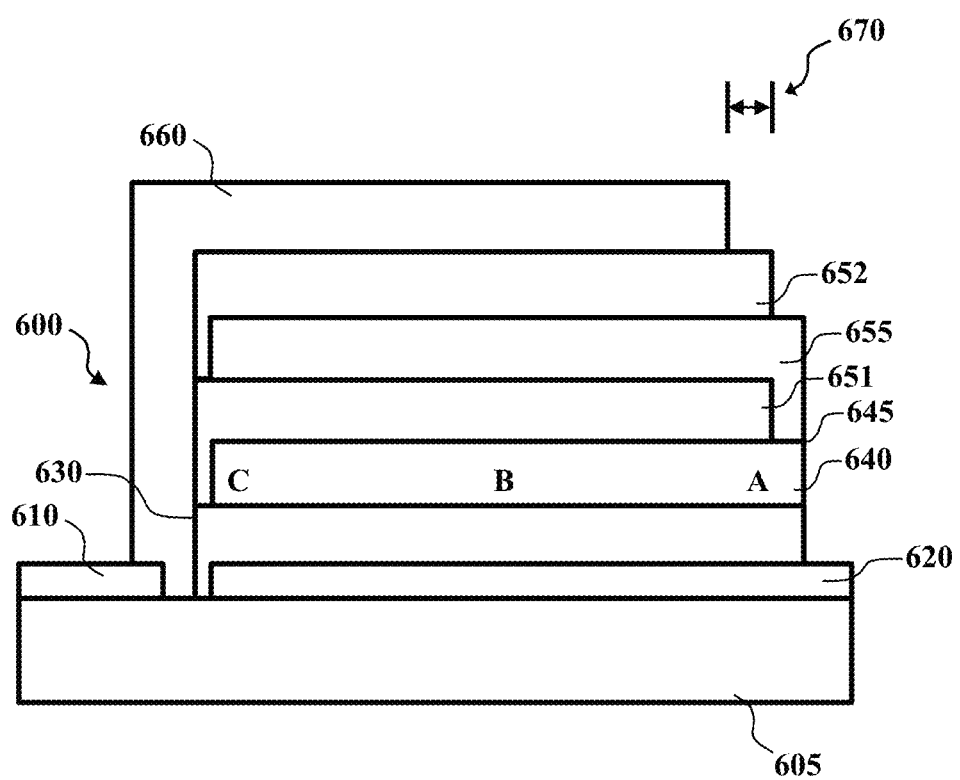
FIG. 3a shows a cross-sectional view of another embodiment of a color-tunable OLED lighting device according to this invention.

Turning now to FIG. 3a, there is shown a cross-sectional view of another embodiment of a color-tunable OLED lighting device according to this invention. Substrate 605, first electrode 620, electrode contact 610, first OLED unit 630, and second electrode 660 of color-tunable OLED lighting device 600 are analogous to substrate 505, first electrode 520, electrode contact 510, first OLED unit 530, and second electrode 560, respectively, of color-tunable OLED lighting device 500. Over first OLED unit 630 are first charge-generating layer 640, second OLED unit 651, second charge-generating layer 655, and third OLED unit 652. Second electrode 660 is over third OLED unit 652. First charge-generating layer 640 and second charge-generating layer 655 are electrically connected at junction 645. Thus, second OLED unit 651 is wedged between the electrically connected charge-carrying layers of first charge-generating layer 640 and second charge-generating layer 655, while first OLED unit 630 and third OLED unit 652 are non-wedged units. The end of second electrode 660 can optionally be offset by a distance 670 from junction 645, as disclosed for color-tunable OLED lighting device 400, above. Charge-generating layers 640 and 655 can have the same or different conductivities. In one useful embodiment, second OLED unit 651 can be a blue (cold) light-emitting unit, first and third OLED units 630 and 652 can be yellow (warm) light-emitting units, and charge-generating layers 640 and 655 have the same conductivity. In principle, at lower voltages, the conductivity of second organic light-emitting unit 651 is low, and the path provided by charge-generating layers 640 and 655 will be preferred to a great extent. Under these conditions, the greatest part of light emission will be provided by the yellow light-emitting OLED units 630 and 652, and will thus be warmer. At higher voltages, the conductivity of second OLED unit 651 becomes greater due to its non-linear current-voltage relationship, and the vertical path through second OLED unit 651 can become the electrical path preferred, instead of the charge-generating layers. Under higher-voltage conditions, blue-light-emitting OLED unit 651 can provide a significant amount of light, and the overall lighting will be bluer or cooler.

Figure 3B:
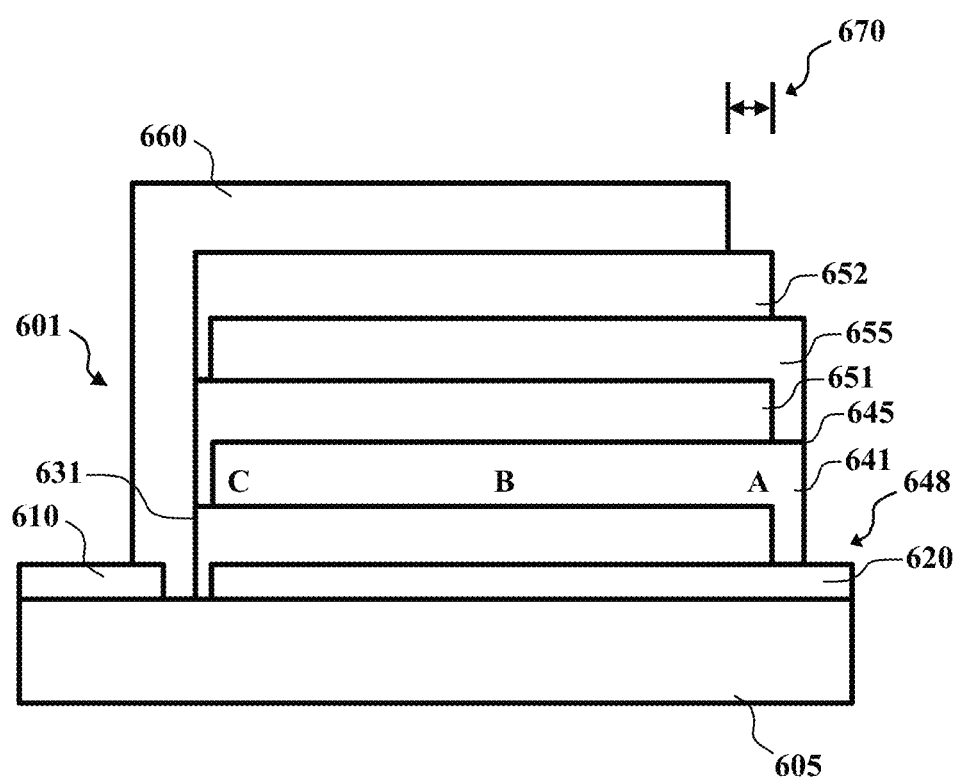
FIG. 3b shows a cross-sectional view of another embodiment of a color-tunable OLED lighting device according to this invention.

Turning now to FIG. 3b, there is shown a cross-sectional view of another embodiment of a color-tunable OLED lighting device according to this invention. In color-tunable OLED lighting device 601, elements numbered identically to color-tunable OLED lighting device 600 of FIG. 3a are substantially the same. However, first charge-generating layer 641 is also electrically connected to first electrode 620 at electrode/CGL junction 648. In this embodiment, first OLED unit 631 is wedged between electrically connected charge-carrying layers first electrode 620 and first charge-generating layer 641, while second OLED unit 651 is wedged between first charge-generating layer 641 and second charge-generating layer 655. Third OLED unit 652 is a non-wedged unit. The lateral conductivity of second charge-generating layer 655 can be the same as or different from that of first charge-generating layer 641. Usefully, when first charge-generating layer 641 and second charge-generating layer 655 have differing conductivities, they will have differing effects on neighboring light-emitting units. Thus, one skilled in the art can vary the conductivities of the various charge-generating layers to fine-tune the performance of the lighting device to obtain desired lighting properties.

Those skilled in the art will recognize that further embodiments are possible using the principles disclosed herein. Although the latter embodiments involve multiple charge-generating layers, the same principles and numerical analysis can be used by those skilled in the art to predict the performance of lighting devices using known light-emitting layers.

In addition to the above, any color-tunable OLED lighting device can include other layers or systems well-known in the art, e.g. overcoats or encapsulation means to prevent exposure to air, without affecting the intended performance of the devices disclosed herein.

In use, the charge-generating layer functions as an auxiliary electrode that is less conductive than a standard electrode, and thus the average and the range of electrical potential on the charge-generating layer varies with the voltage between the anode and cathode. Standard electrodes, such as first electrode 120 and second electrode 160 of color-tunable OLED lighting device 100, are designed to have high lateral conductivity. This allows a substantially constant potential and current density across the area of the electrodes. For example, the potential at all points of second electrode 160 is substantially the same as the potential applied externally at electrode contact 110. By contrast, the organic layers of organic light-emitting units 130 and 150 are designed to have significantly higher lateral resistivity, thus restricting lateral current in the light-emitting units and substantially limiting current through the organic layers to the vertical direction. The combination of highly conductive electrodes and far less conductive organic layers would allow, in the absence of the external connection between charge-generating layer 140 and electrode 120, a substantially even distribution of vertical current across the area of the device and substantially even emission of light across the area of the device.

Charge-generating layer 140 is selected to have a lower lateral conductivity than electrodes 120 and 160, but a higher lateral conductivity than organic light-emitting units 130 and 150. Thus, charge-generating layer 140 can have some lateral conductivity, but not sufficient conductivity to maintain an even potential across its length. For example, in FIG. 1a, charge-generating layer 140 at the point labeled "A" will have substantially the same potential as first electrode 120. At point "A" little or no current will pass through first organic light-emitting unit 130 and little or no light will be emitted by first organic light-emitting unit 130. At point "A", the light emitted by color-tunable OLED lighting device will be primarily or entirely that of second organic light-emitting unit 150. At the point labeled "C", charge-generating layer 140 can have a potential that is closer to or at an equilibrium potential between first and second light-emitting units 130 and 150. Equilibrium potential as used herein means that current density (current per unit horizontal area) is equal through both organic light-emitting units 130 and 150, such that at point "C", both units will be emitting light, making the overall emission color different from that at point "A". At some point in between, e.g. point "B", charge-generating layer 140 can have a potential between those at points "A" and "C", and the color of light emitted at point "B" can be different from that emitted at either point "A" or "C". This means that, in the simplest case, the color of OLED lighting device 100 can be made to vary over its surface, e.g. from point "A" to point "C". As will be further disclosed, the way in which OLED lighting device 100 varies in color will depend upon a number of factors: 1) the intrinsic conductivity of the material chosen to make charge-generating layer 140; 2) the thickness of charge-generating layer 140; 3) the distance from the point of electrode contact (e.g. the connection with first electrode 120) to the point under consideration (e.g. "B"); 4) the non-linear current-voltage characteristics of organic light-emitting units 130 and 150; and 5) the potential difference between first electrode 120 and second electrode 160. Factors 1-3 are selected in the preparation of the lighting device and determine the overall properties of charge-generating layer 140 (e.g. the resistivity in ohms/square of the layer). Factor 4, which can be different for each light-emitting unit, is also selected in the preparation of the lighting device. Factor 5 can be under the control of the end-user, and allows the device to be color-tunable in use, as will be shown.

To consider the actual color balance of a device of this sort, one must consider the potential of charge-generating layer 140 across its area and the current densities through the two organic light-emitting units across their areas. For the purpose of this discussion, first organic light-emitting unit 130 will be selected to be a blue-emitting unit, second organic light-emitting unit 150 will be considered to be a yellow-emitting unit, first electrode 120 is an anode, and second electrode 160 is a cathode whose voltage is nominally zero. In the simple embodiment in FIG. 1a, where the contact between charge-generating layer 140 and anode 120 occurs along one edge perpendicular to the x direction, a differential current balance on the cell results in the following nonlinear second-order ordinary differential equation:

$$(i_y - i_b)R_s = \frac{d^2 v_{CGL}}{dx^2} \tag{1}$$

In Equation (1), $i_y$ and $i_b$ are the current densities in the yellow and blue units (that is, second and first organic light-emitting units 150 and 130, respectively), which themselves are functions of the anode-to-cathode voltage and the local voltage of charge-generating layer 140; $R_s$ is the lateral sheet resistance of charge-generating layer 140; $v_{CGL}$ is the voltage in charge-generating layer 140 (cathode or second electrode 160 voltage=0); and x is the distance from electrode/CGL junction 145. The boundary conditions for the embodiment of FIG. 1a are as follows:

$$v_{CGL} = v_{Anode} \text{ at } x = 0, \quad (2a)$$

and $$\frac{dv_{CGL}}{dx} = 0 \text{ at } x = 1 \quad (2b)$$

The former boundary condition states that the voltage of charge-generating layer 140 at the anode connection end (e.g. at point "A") is equal to the voltage of anode 120. The latter condition states that no current flows laterally into or out of charge-generating layer 140 at the unconnected end (e.g. beyond point "C"). Equations 1, 2a, and 2b comprise a nonlinear two-point boundary value problem which can be solved using standard numerical methods, such as finite difference methods (see for example Atkinson, K. E., Han, W. and Stewart, D. (2009) "Chapter 11. Two-point boundary value problems", in "Numerical Solution of Ordinary Differential Equations", John Wiley & Sons, Inc., Hoboken, N.J., USA. doi: 10.1002/9781118164495.ch11, or an equivalent numerical methods text).

The power lost (per unit width normal to x) is:

$$P_{loss\ in\ CGL} = \frac{1}{R_s} \int_0^1 \left[ \frac{dv_{CGL}}{dx} \right]^2 dx \quad (3)$$

Figure 4A:
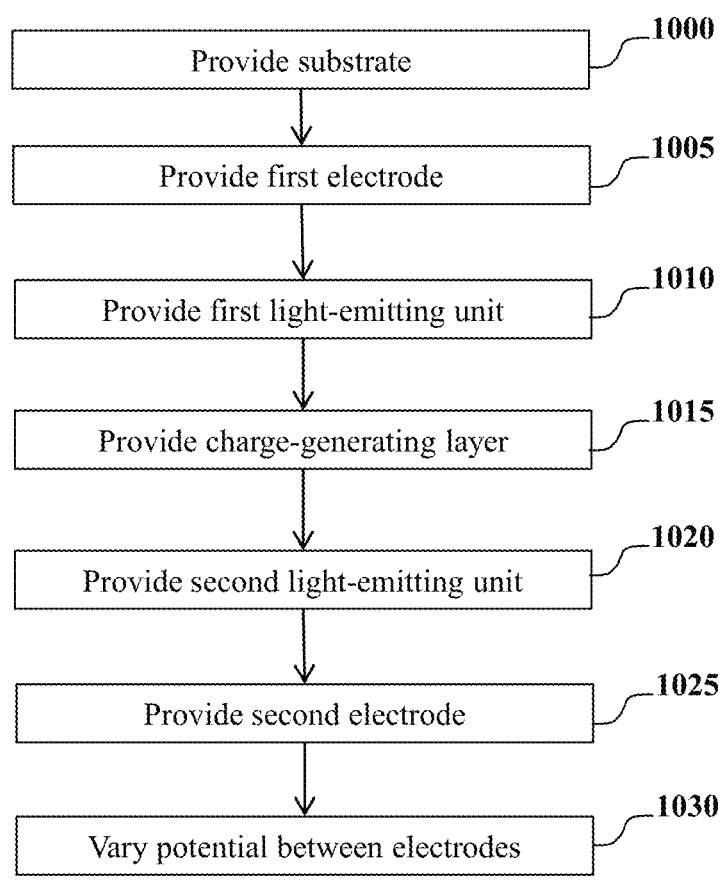
FIG. 4a is a schematic view of one embodiment of the method of this invention.

Turning now to FIG. 4a, and referring also to FIG. 1a through 2b, there is shown a schematic view of one embodiment of the method of this invention. In step 1000, a substrate (e.g. substrate 105) is provided. Substrate 105 can include other structures, e.g. electrode contact 110. In step 1005, a first electrode (e.g. first electrode 120) is provided on the substrate. In step 1010, a first light-emitting unit (e.g. first organic light-emitting unit 130) is provided over the first electrode. In step 1015, a charge-generating layer (e.g. charge-generating layer 140) is provided over the first light-emitting unit, and is either connected to the first electrode (e.g. at electrode/CGL junction 145) or provided in such a way that a later-deposited second electrode can be connected to it. The necessary properties of the charge-generating layer can be determined by one skilled in the art by experimentation, or by a knowledge of the properties of the light-emitting units and solution of the differential equations of the present disclosure. In step 1020, a second light-emitting unit (e.g. second organic light-emitting unit 150) is provided over the charge-generating layer. In step 1025, a second electrode (e.g. second electrode 160) is provided over the second light-emitting unit. In step 1030, a potential is applied to the two electrodes, e.g. by variable voltage source 115, and the potential is varied to vary the ratio of light produced by the first and second light-emitting units, and therefore vary the color emitted by the device.

Figure 4B:
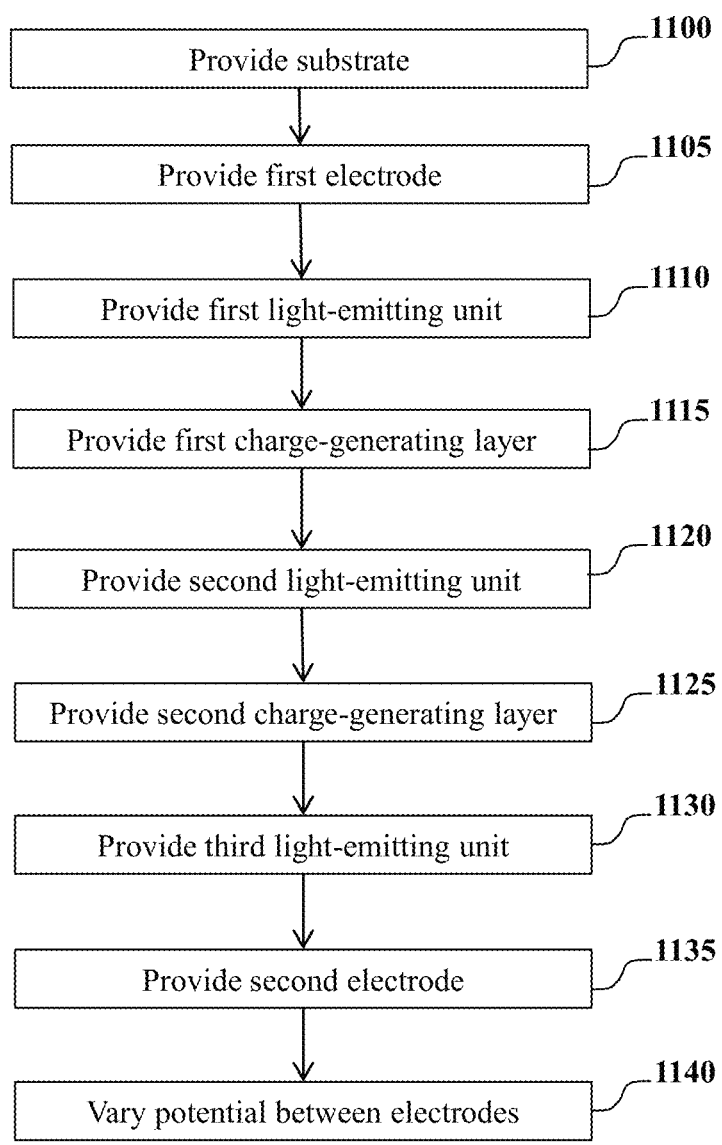
FIG. 4b is a schematic view of another embodiment of the method of this invention.

Turning now to FIG. 4b, and referring also to FIG. 3a, there is shown a schematic view of another embodiment of the method of this invention. In step 1100, a substrate (e.g. substrate 605) is provided. Substrate 605 can include other structures, e.g. electrode contact 610. In step 1105, a first electrode (e.g. first electrode 620) is provided on the substrate. In step 1110, a first light-emitting unit (e.g. first organic light-emitting unit 630) is provided over the first electrode. In step 1115, a first charge-generating layer (e.g. charge-generating layer 640) is provided over the first light-emitting unit. The necessary properties of the charge-generating layer can be determined by one skilled in the art by experimentation, or by a knowledge of the properties of the light-emitting units and solution of the differential equations of the present disclosure. In step 1120, a second light-emitting unit (e.g. second organic light-emitting unit 651) is provided over the first charge-generating layer. In step 1125, a second charge-generating layer (e.g. second charge-generating layer 655) is provided over the second light-emitting unit in such a manner as to be electrically connected to the first charge-generating layer. In step 1130, a third light-emitting unit (e.g. third organic light-emitting unit 652) is provided over the second charge-generating layer. In step 1135, a second electrode (e.g. second electrode 660) is provided over the second light-emitting unit. In step 1140, a potential is applied to the two electrodes, e.g. by a variable voltage source as known in the art, and the potential is varied to vary the ratio of light produced by the first, second, and third light-emitting units, and therefore vary the color emitted by the device.

EXAMPLE 1

Figure 5:
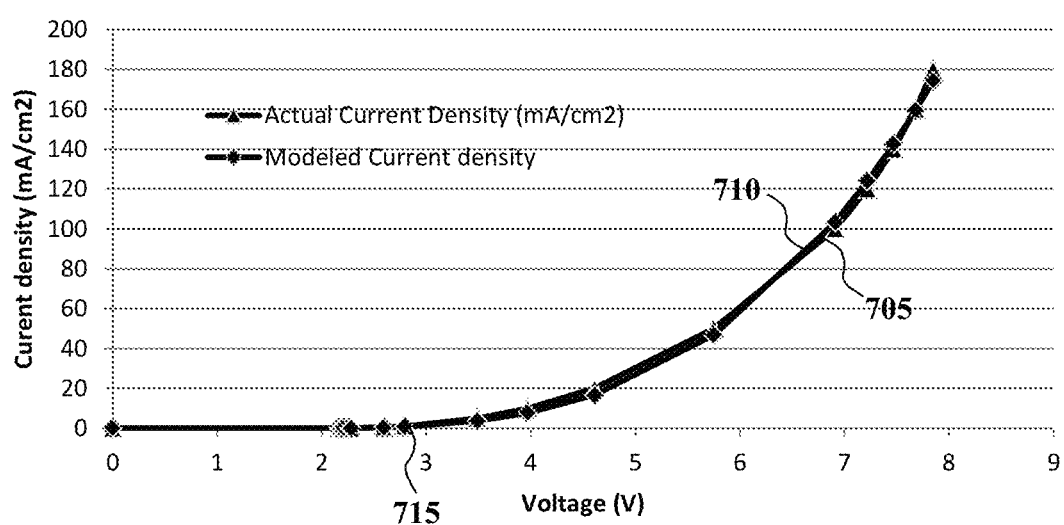
FIG. 5 shows a characteristic curve of current density vs. voltage for an organic light-emitting device.

Turning now to FIG. 5, there is shown a characteristic curve of current density (in mA/cm$^2$) vs. voltage for an organic light-emitting unit. The light emitted by such a unit, in candelas per unit area, will be proportional to the current density. Line 705 shows measured current density for a yellow-red light-emitting unit stack. Line 705 is non-linear and has a practical threshold voltage 715, below which substantially no current flows, and therefore substantially no light is emitted. Line 710 is a modeled current density for the organic light-emitting unit using the following equation form:

$$\text{If } V_y > VTO_y \text{ then } i_y = a(V_y - VTO_y)^\beta \text{ else } i_y = 0 \quad (4)$$

For the yellow-red OLED unit used in the present example, the parameters used to fit the data in FIG. 5 are: $\alpha = 0.508$; $VTO_y = 1.63$; and $\beta = 3.19$. In Equation (4), the voltage $V_y$ and threshold voltage $VTO_y$ are in Volts, and the current density $i_y$ is in mA/cm$^2$. Threshold voltage $VTO_y$ is an absolute threshold voltage for current flow and light emission, and differs from practical threshold voltage 715 in that practical threshold voltage 715 is an approximate value below which the small amount of light emitted by that unit does not significantly change the overall color emitted by the device, e.g. when one light-emitting unit provides 5% or less of the total emitted light. The luminance efficiency of this organic light-emitting unit is 33 cd/A and this value can be considered constant over the range of current densities of interest in these examples.

Because Eq. 4 models the measured data closely, it can be used with Eq. 1 and 3, above, to calculate the relative current densities, and therefore relative amounts of emitted light, in the various organic light-emitting units. In this and other examples, the same characteristic curve will be used to model all light-emitting units of a given device. In most cases, the use of different-colored light-emitting units comprising different materials will mean different characteristic curves that must be used for each unit, because of different current-voltage characteristics and different light characteristics, e.g. relative luminance efficiency. However, the case of modeling multiple light-emitting units with the same characteristic curve and assuming the same light-emitting characteristics will serve to illustrate the principles and utility of the present invention.

Figure 6A:
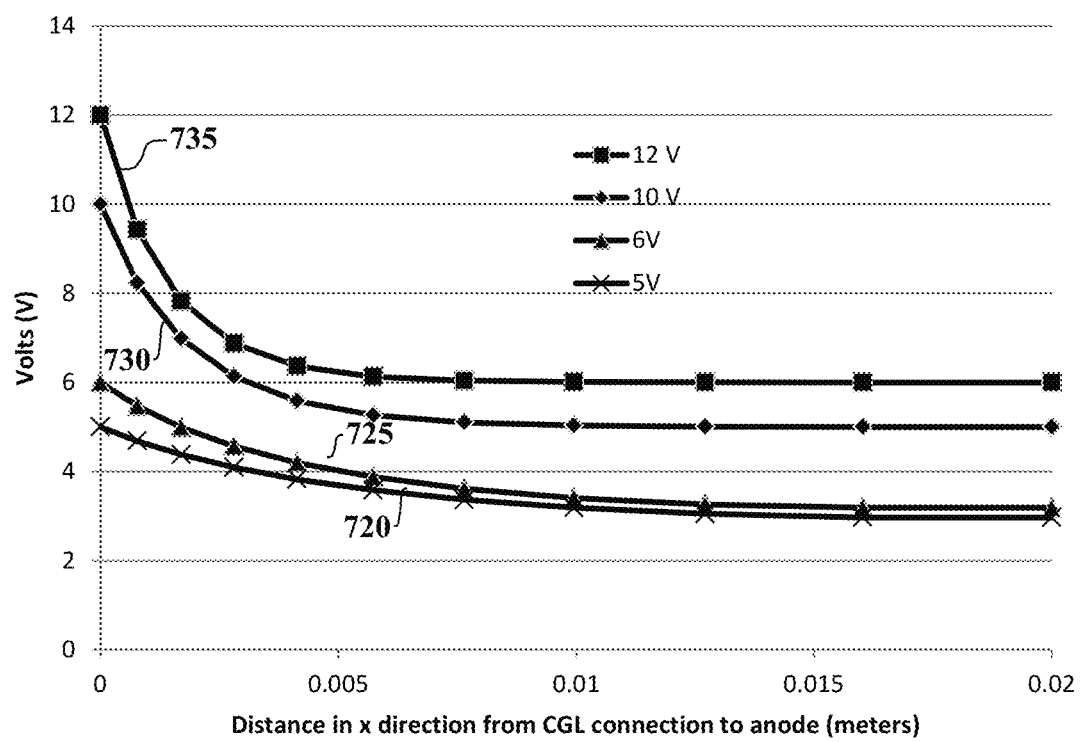
FIG. 6a shows the voltage of a charge-generating layer of one embodiment of a color-tunable OLED device of this invention at anode voltages of 5 volts, 6 volts, 10 volts, and 12 volts.

Turning now to FIG. 6a, and referring also to FIG. 1a, there is shown the voltage of charge-generating layer 140 of color-tunable OLED device 100 (FIG. 1a) at anode voltages of 5 volts, 6 volts, 10 volts, and 12 volts (lines 720, 725, 730, and 735, respectively). These are all light-producing voltages, that is, voltages at which at least some perceptible light is produced by the device. The size of the pixel (that is, the "A" to "C" distance in FIG. 1a) is 2 cm, and the resistivity of charge-generating layer 140 is 530 ohms/square. Because the two light-emitting units have the same characteristics, the equilibrium voltage for charge-generating layer will be one-half the anode voltage. The actual voltage of the line at any given point represents the potential across second OLED unit 150 at that location, while the difference between the voltage shown in the graph and the anode voltage represents the potential across first OLED unit 130.

Of particular note are the curves at 5 and 6 volts. At an anode voltage of 5 volts, which shall be considered a first light-producing voltage, the voltage of charge-generating layer 140 is not at the equilibrium voltage of 2.5 volts at any location. The maximum potential across first light-emitting unit 130, which is a wedged light-emitting unit, is approximately 2 volts. From FIG. 5, it can be seen that a voltage of 2.5 volts or less results in essentially no vertical current, that is, it is below the practical threshold voltage of the light-emitting unit, which is approximately 2.8 volts. On the other hand the voltage across light-emitting unit 150, which is a non-wedged light-emitting unit, varies from about 5 volts to about 3 volts, so that it will carry vertical current and be light-emitting across much of its area. At an anode voltage of 6 volts, the difference between the anode voltage and the charge-generating layer voltage approaches an equilibrium voltage of 3.2 volts, and thus a small portion of first light-emitting unit 130 near point "C" will emit a small amount of light, but the practicality is that the device will appear to the viewer to be almost the same color (the color of light-emitting unit 150). The minimum desirable difference between the equilibrium voltage of charge-generating layer 140 and the voltage of anode 120 is approximately equal to or just slightly less than the practical threshold voltage of the light-emitting unit between the charge-generating electrode and its connected electrode (e.g. light-emitting unit 130 in this embodiment). Stated another way, the lowest useful voltage for controlling the color of the light emission in devices of the instant invention is such that the spatial voltage change across the charge-generating layer is less than or equal to the practical threshold voltage of the light-emitting unit between the charge-generating layer and its connected electrode (e.g. light-emitting unit 130 of color-tunable OLED lighting device 100).

At an anode voltage of 12 volts, which shall be considered a second light-producing voltage, it can be seen that the difference between the anode voltage and the charge-generating layer voltage is 3 volts or greater over approximately 95% of the area, and at or near 6 volts over more than half of the area. Thus, according to FIG. 5, first light-emitting unit 130 will conduct significant current and emit significant light over much of its area. If first light-emitting unit 130 emits blue light and second light-emitting unit 150 emits yellowish white light, the viewer will see a yellowish-white or warm light at an anode voltage of 6 volts, and will see a bluer white or colder light at an anode voltage of 12 volts.

Figure 6B:
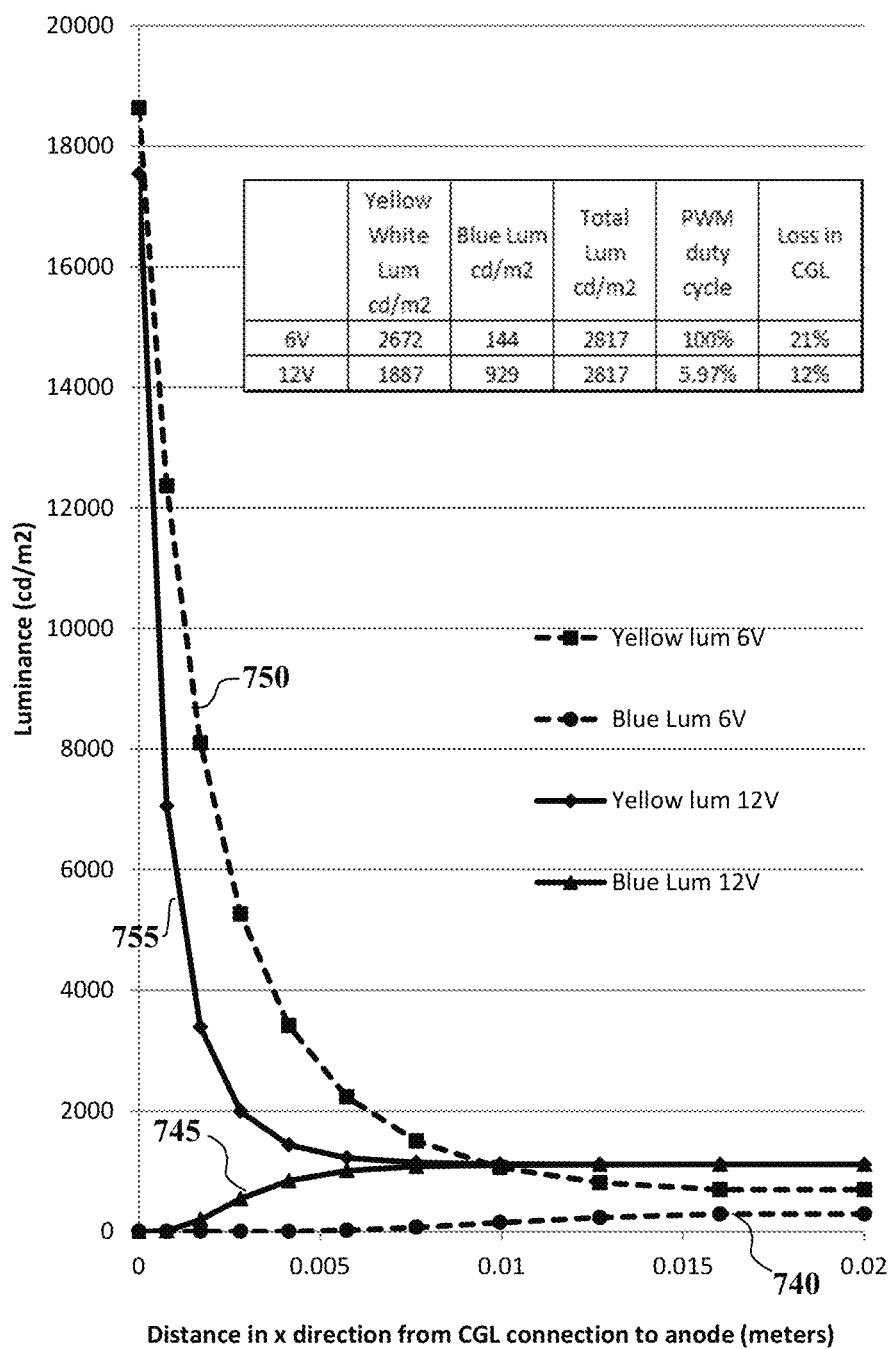
FIG. 6b shows the resulting emission from the color-tunable OLED device of FIG. 6a with anode voltages of 6 volts and 12 volts.

Turning now to FIG. 6b, there is shown the resulting emission from color-tunable OLED device 100 with anode voltages of 6 volts and 12 volts at the conditions of FIG. 6a. The curves represent wedged first light-emitting unit 130 at 6 volts (curve 740) and 12 volts (curve 745) and non-wedged second light-emitting unit 150 at 6 volts (curve 750) and at 12 volts (curve 755). Because of the increased overall emissions at 12 volts, the duty cycle of the device was reduced (e.g. by pulse-width modulation) to produce the same total luminance of 2817 cd/m$^2$ as at 6 volts at 100% duty cycle. It can be seen that at 6 volts, wedged first light-emitting unit 130 just barely emits a small amount of light (about 5% of the total) at 6 volts. At 12 volts, the emission of first light-emitting unit 130 is approximately ⅓ of the total emission. Again assuming first light-emitting unit 130 emits blue light and second light-emitting layer 150 emits yellowish white light, the results at 6 volts are a warmer or yellowish white light, and at 12 volts a colder or more bluish white light. The power loss in charge-generating layer 140, calculated from Eq. 2, is 12% at 12 volts, and 21% at 6 volts, relative to a cell without electrode/CGL junction 145. While this is a measurable loss of power, organic light-emitting units are in general efficient emitters of light, and this level of power loss can be a relatively small tradeoff for the ability to control the color of the light emission by the device. Some devices have controlled the relative emissions of two layers with a charge-generating layer wherein the voltage of such a layer is independently controlled by an outside source. Such an apparatus requires a third connection to control the charge-generating layer voltage, in addition to the normal anode and cathode connections. Further, such an apparatus would be especially problematic for a series device, such as that shown in FIG. 1c, because each charge-generating layer in the series chain would have a different voltage and require its own controller. In contrast, the device of the present invention can vary the color, and with pulse-width modulation the brightness, of a serial device of FIG. 1c with only the normal anode and cathode connections at the ends of the serial chain.

FIG. 6b shows when one looks at the emitting cell, particularly at 12 volts, one can see a noticeable variation in color across the length of the cell. However, since this device can be used in lighting that users will generally not be looking at directly, this will be less noticeable. The obvious variation can be further reduced by incorporating a diffusing screen as part of the device. Such screens are well-known in the art and are used on commercially available devices, e.g. by Verbatim.

EXAMPLE 2

Figure 7A:
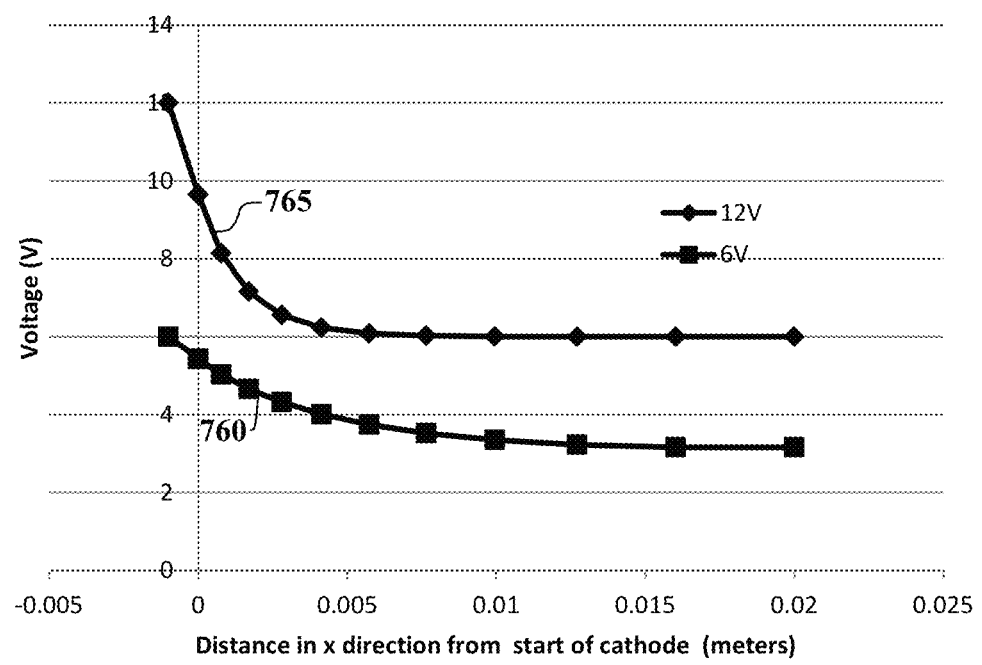
FIG. 7a shows the voltage of a charge-generating layer of another embodiment of a color-tunable OLED device of this invention at anode voltages of 6 volts and 12 volts.

Turning now to FIG. 7a, there are shown calculated graphs of the voltage of charge-generating layer 440 of color-tunable OLED lighting device 400 in FIG. 1e at anode voltages of 6 volts (curve 760) and 12 volts (curve 765). In color-tunable OLED lighting device 400, the width of charge-generating layer 440 (the distance from "A" to "C") is 2.1 cm. However, the contact between charge-generating layer 440 and anode 420 is offset by 1 mm (distance 470) from the end of cathode 460, so that the total width of the emitting area of second OLED unit 450 is 2 cm, as determined by the overlap of cathode 460 with anode 420 and charge-generating layer 440. This has the effect of putting the highest voltage of charge-generating layer 440 outside of the emitting area of second OLED unit 450. In FIG. 7a, the emitting area of second OLED unit 450 starts at x=0. Charge-generating layer 440 starts at x=−0.001 meters. For example, at 12 volts on the anode, the maximum voltage applied to second OLED unit 450 is seen to be less than 10 volts.

Figure 7B:
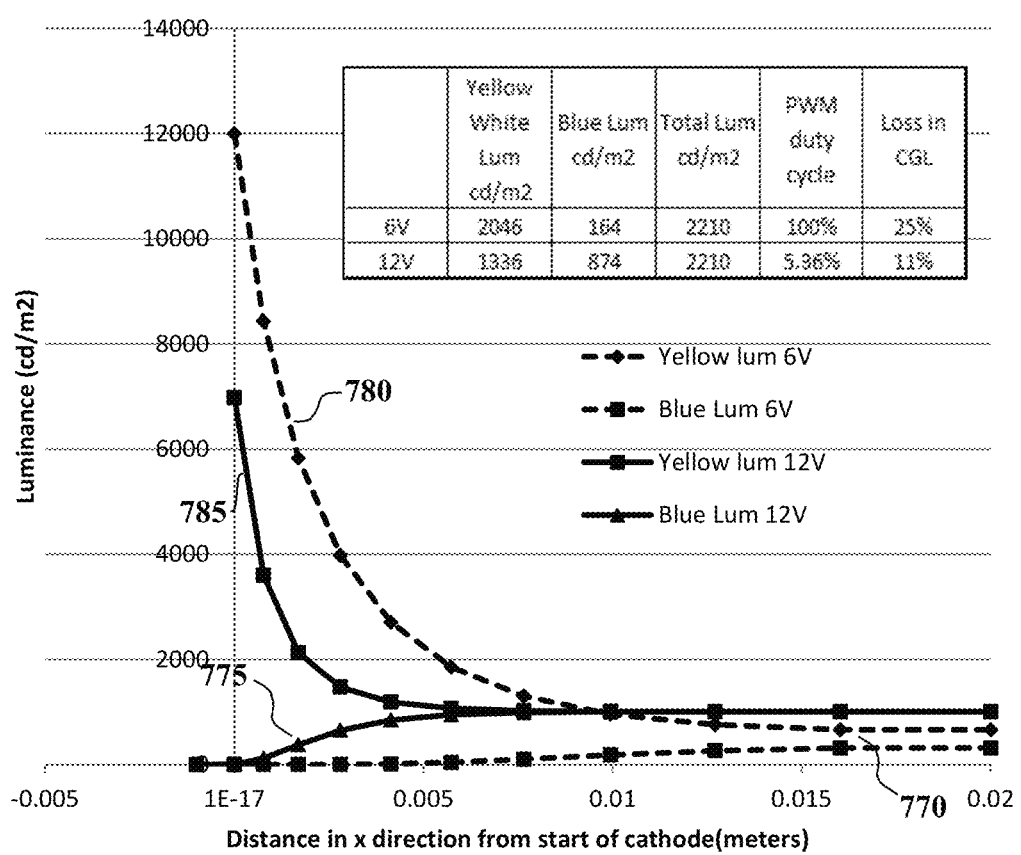
FIG. 7b shows the resulting emission from the color-tunable OLED device of FIG. 7a with anode voltages of 6 volts and 12 volts.

Turning now to FIG. 7b, there is shown the resulting emission from color-tunable OLED device 400 with anode voltages of 6 volts and 12 volts at the conditions of FIG. 7a. The curves represent first light-emitting unit 430 at 6 volts (curve 770) and 12 volts (curve 775) and second light-emitting unit 450 at 6 volts (curve 780) and at 12 volts (curve 785). Because of the increased overall emissions at 12 volts, the duty cycle of the device was reduced (e.g. by pulse-width modulation) to produce the same total luminance of 2210 cd/m$^2$ as at 6 volts at 100% duty cycle. This device shows the same general properties as shown in FIG. 6b. At 6 volts, the majority of the light (>90%) is emitted by second light-emitting unit 450, while at 12 volts, first light-emitting unit 430 emits about 40% of the overall light. If first light-emitting unit 430 emits blue light and second light-emitting layer 450 emits yellowish white light, the results at 6 volts are a warmer or yellowish white light, and at 12 volts a colder or more bluish white light. The power loss in charge-generating layer 440, calculated from Eq. 2, is 11% at 12 volts, and 25% at 6 volts. An advantage of this embodiment can be seen by comparing the emission of the second light-emitting layers at the connected edge, e.g. at x=0 (FIG. 6b). In color-tunable OLED lighting device 100, the emission could be over 18,000 cd/m$^2$, while in color-tunable OLED lighting device 400, the maximum emission was approximately 12,000 cd/m$^2$. The lower emission reduces the appearance of an extremely bright area, and will also subject that area to a lesser degree of deterioration (e.g. color fade) with time.

EXAMPLE 3

Figure 8A:
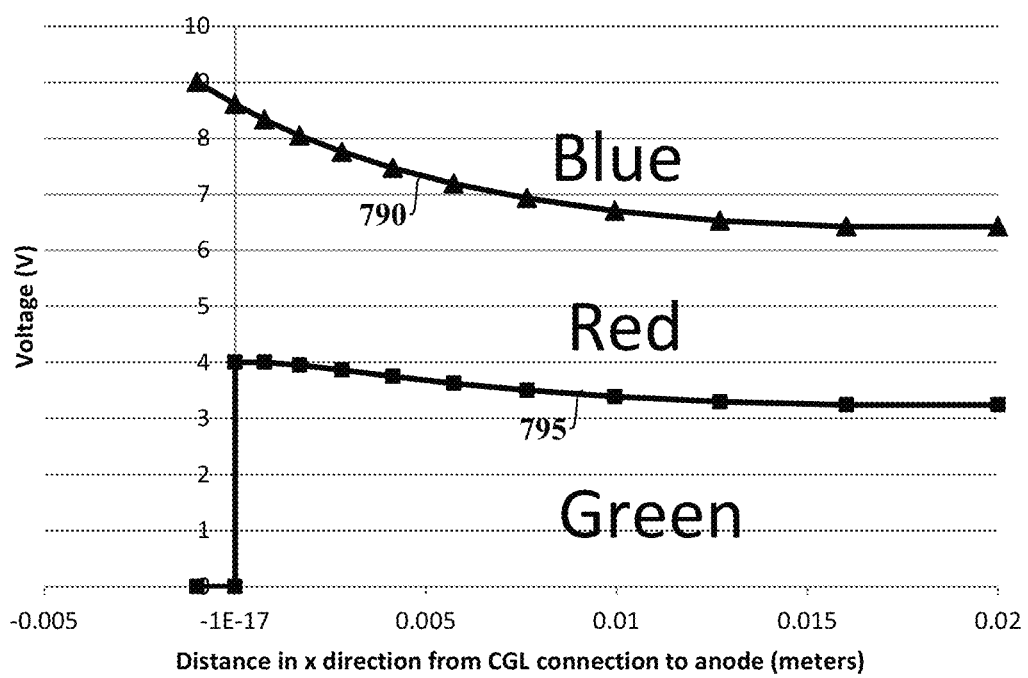
FIGS. 8a and 8b show the voltage of a charge-generating layer of another embodiment of a color-tunable OLED device of this invention at anode voltages of 9 volts and 18 volts, respectively.
Figure 8B:
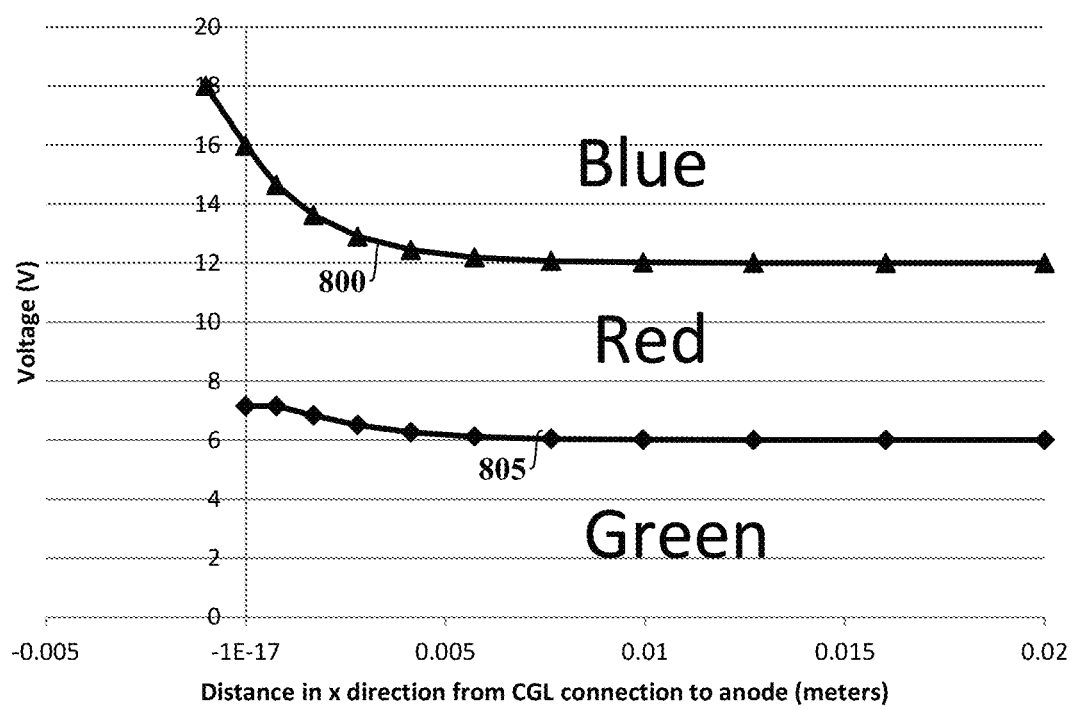

Turning now to FIGS. 8a and 8b, there are shown calculated graphs of the voltage of charge-generating layers 540 and 555 of color-tunable OLED lighting device 500 in FIG. 2a. Charge-generating layer 540 has a resistivity of 530 ohms/square, while charge-generating layer 555 has a resistivity of 1600 ohms/square. The width of charge-generating layers 540 and 555 are 2.1 cm, and cathode 560 is offset by 1 mm, making the total width of the emitting area 2 cm, as determined by the overlap of cathode 560 with anode 520 and charge-generating layers 540 and 555. First organic light-emitting unit 530 is a blue-emitting unit, organic light-emitting subunit 551 is a red-emitting unit, and organic light-emitting subunit 552 is a green-emitting unit. By blue-, red-, and green-emitting, it will be understood that the unit emits a greater portion of its light in that color, but is not necessarily primarily that color, as a display emitter would be. For example, the green emitter can be emitting white light largely centered on green, the red emitter can be emitting orange, and the blue emitter can be a bluish green. FIG. 8a shows the voltages of the two layers at an anode voltage of 9 volts (3 volts per light-emitting unit, if the device were at total equilibrium). The voltage of charge-generating layer 540 is shown by curve 790; that of charge-generating layer 555 is shown by curve 795. FIG. 8b shows the corresponding voltages at an anode voltage of 18 volts (6 volts per light-emitting unit, assuming total equilibrium). The voltage of charge-generating layer 540 is shown by curve 800; that of charge-generating layer 555 is shown by curve 805. Because charge-generating layer 540 has a potential difference across its surface, and charge-generating layer 555 also has some conductivity across its surface, each can affect the potential of the other.

Figure 8C:
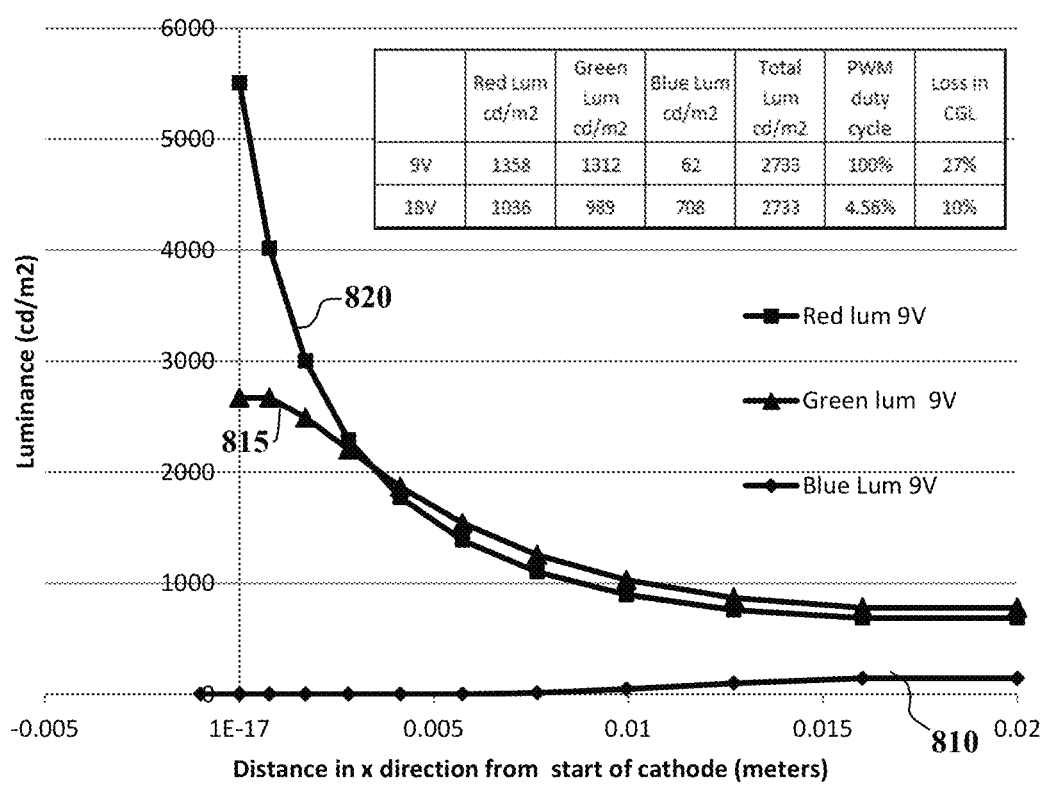
FIGS. 8c and 8d show the resulting emission from the color-tunable OLED device of FIGS. 8a and 8b, respectively, with anode voltages of 9 volts and 18 volts, respectively.
Figure 8D:
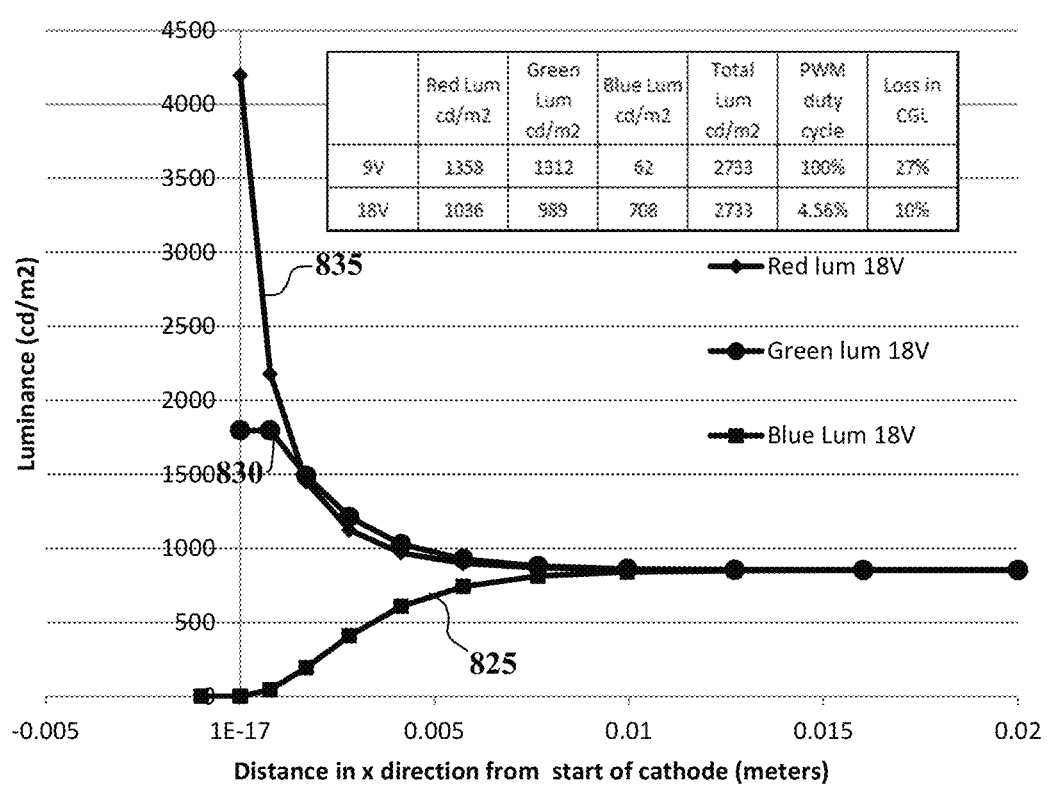

Turning now to FIGS. 8c and 8d, there are shown the resulting emissions. FIG. 8c shows the resulting emission from color-tunable OLED device 500 with anode voltage of 9 volts at the conditions of FIG. 8a. The emission of first OLED unit 530 is shown by curve 810; that of OLED subunit 551 by curve 815; and that of OLED subunit 552 by curve 820. FIG. 8d shows the resulting emission from color-tunable OLED device 500 with anode voltage of 18 volts at the conditions of FIG. 8b. The emission of first OLED unit 530 is shown by curve 825; that of OLED subunit 551 by curve 830; and that of OLED subunit 552 by curve 835. At 18 volts, the duty cycle of the device is reduced so as to produce the same total luminance of 2733 cd/m$^2$ as at 9 volts with 100% duty cycle. A comparison of FIGS. 8c and 8d shows that at 9 volts, the emission from the device is largely from the green and red emitters, with only a small amount of blue light. That is, 9 volts produces a yellow or yellowish white light. At 18 volts, more than half of the area of the device is near the equilibrium level and produces a significantly greater amount of blue light. At 18 volts, the emitted light is overall a bluer white. One advantage of using a second charge-generating layer 555 is that the peak luminance near the electrode/CGL junction is reduced from 12000 cd/m$^2$ (as in FIGS. 7b) to 5500 cd/m$^2$ (as in FIG. 8c). If second charge-generating layer 555 were not present (or lacked the conductivity to carry significant current), the luminance of organic light-emitting subunits 551 and 552 would be identical in this simple simulation since both subunits have identical voltage-current characteristics. FIGS. 8c and 8d show that the peak luminance of organic light-emitting subunit 552 is less than half that of subunit 551 as some current through subunit 551 is transported laterally though the second charge-generating layer 555, making the subunit 552 emission (that is, green in this example) more uniform than either the red or blue emissions. Thus by using a second charge-generating layer with lateral resistance low enough to carry some current, organic light-emitting subunit 552 is more uniform over its area. In devices such as those of FIG. 2a, it can be advantageous to have one entity (e.g. subunit 552) provide a relatively uniform light output as the relative light emission from other entities (e.g. light-emitting unit 530 and light-emitting subunit 551) is varied to adjust the color temperature of the emitted light. It can be desirable that the more uniform light-emitting entity emit light centered around the green region of the spectrum, as this can lead the viewer to perceive a more uniform color distribution across the area of the lighting device.

EXAMPLE 4

Figure 9A:
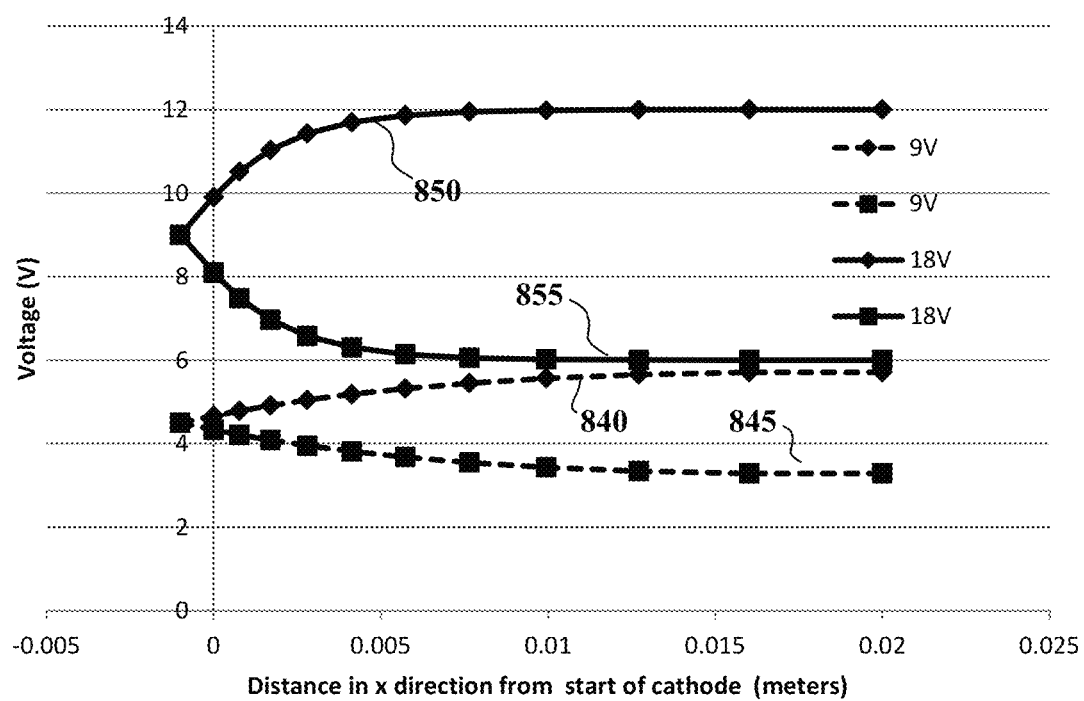
FIG. 9a shows the voltage of a charge-generating layer of another embodiment of a color-tunable OLED device of this invention at anode voltages of 9 volts and 18 volts.

Turning now to FIG. 9a, there are shown calculated graphs of the voltage of charge-generating layers 640 and 655 of color-tunable OLED lighting device 600 in FIG. 3a. Charge-generating layers 640 and 655 have a resistivity of 200 ohms/square. The width of charge-generating layers 640 and 655 are 2.1 cm, and cathode 660 is offset by 1 mm, making a total width of 2 cm of the emitting area under cathode 660, and putting the junction of the two charge-generating layers at –0.001 meters in FIG. 9a. First organic light-emitting unit 630 and third organic light-emitting unit 652 are yellow-emitting units, and second organic light-emitting unit 651 is a blue-emitting unit. By yellow- and blue-emitting, it will be understood that the unit emits a greater portion of its light in that color, but is not necessarily primarily that color, as a display emitter would be. FIG. 9a shows the voltages of the two layers at an anode voltage of 9 volts (first charge-generating layer 640 is shown by curve 840 and second charge-generating layer 655 by curve 845; 3 volts per light-emitting unit, assuming total equilibrium) and at an anode voltage of 18 volts (first charge-generating layer 640 is shown by curve 850 and second charge-generating layer 655 by curve 855; 6 volts per light-emitting unit, assuming total equilibrium).

At the junction of the two charge-generating layers, they both necessarily have the same potential, and those potentials diverge across the width of the lighting device. At an anode voltage of 9 volts, they would be at equilibrium at 6 volts (charge-generating layer 640) and 3 volts (charge-generating layer 655). The two charge-generating layers do not reach these values, and the maximum voltage difference between them is about 2.5 volts, a value that is not sufficient (FIG. 5) to produce much light. At an anode voltage of 9 volts, second organic light-emitting unit 651 will produce very little light. At 18 volts, the two charge-generating layers are at their equilibrium values of 12 volts (charge-generating layer 640) and 6 volts (charge-generating layer 655) across more than half the area of the device. The equilibrium difference between the two charge-generating layers, 6 volts, is sufficient (FIG. 5) to produce a significant current density, and therefore a significant amount of light. At an anode voltage of 18 volts, all organic light-emitting units will have significant contribution to the light produced.

Figure 9B:
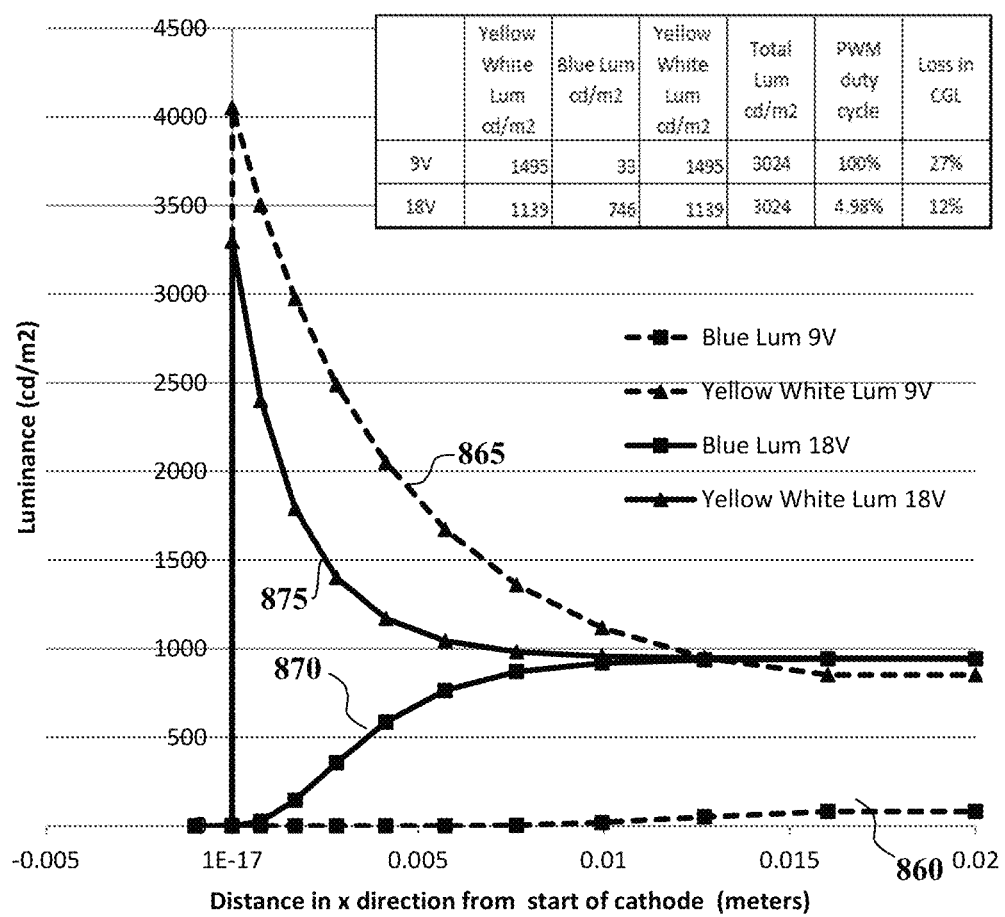
FIG. 9b shows the resulting emission from the color-tunable OLED device of FIG. 9a with anode voltages of 9 volts and 18 volts.

Turning now to FIG. 9b, there are shown the resulting emissions from color-tunable OLED device 600 with anode voltage of 9 volts (dashed lines) and with anode voltage of 18 volts (solid lines). At 18 volts, the duty cycle of the device is reduced so as to produce the same total luminance of 3024 cd/m² as at 9 volts with 100% duty cycle. At 9 volts, the emission from the device is largely from the yellow emitting OLED units 630 and 652 (curve 865), with only a small amount of light from second OLED unit 651 (curve 860). That is, 9 volts produces a yellow or yellowish white light. At 18 volts, more than half of the area of the device is near the equilibrium level. OLED unit 651 produces a significantly greater amount of blue light (curve 870), while that of yellow emitting OLED units 630 and 652 is diminished somewhat (curve 875). At 18 volts, the emitted light is a bluer white. One advantage of this embodiment is that the peak luminance near the electrode/CGL junction is reduced even further, to about 4000 cd/m². The lower emission reduces the appearance of an extremely bright area, and will also subject that area to a lesser degree of deterioration (e.g. color fade) with time.

Source of Differential Equations

Equation (1) is obtained by considering the current flows through a portion dx of the length of charge-generating layer 140. Without any loss of generality, the following conventions were used in the modeling:
1. The first electrode, on the substrate, is the anode, the OLED architecture is "normal bottom emitting", with light transmitted out through the substrate, and the second or top electrode is a reflective cathode.
2. The device is a tandem OLED with 2 light emitting units (also known as stacks) with a charge-generating layer as disclosed herein between them. The bottom OLED unit (next to the anode) emits blue light, and the top OLED stack (next to the cathode) emits yellow light.
3. Current flow is shown as "electron" flow, with the positive sense being flow from cathode to anode.
4. The charge-generating layer (CGL) is a conductive and substantially transparent layer with thickness h (meters) in the z dimension and bulk resistivity ρ (ohm meters). The lateral sheet resistance of CGL is $R_s = \rho/h$ (ohms per square, or ohms).
5. The emitting area is w units wide in the y dimension, where the contact of the charge-generating layer to the electrode is made on an edge that is parallel to the y axis and the point of contact is considered to be zero in the x dimension. The charge-generating layer is connected to the anode in this embodiment. The emitting area is 1 units long in the x dimension, the horizontal direction normal to the CGL connection.
6. All currents are shown as current densities $i_b$, $i_y$, $i_{CGL}$ (A/m²), where b refers to the blue OLED unit current density flowing vertically, y refers to the yellow OLED unit current density flowing vertically, and CGL refers to the current density in the CGL flowing horizontally.
7. The cathode voltage is assigned to zero volts. The anode voltage can be adjustable.

Figure 10:
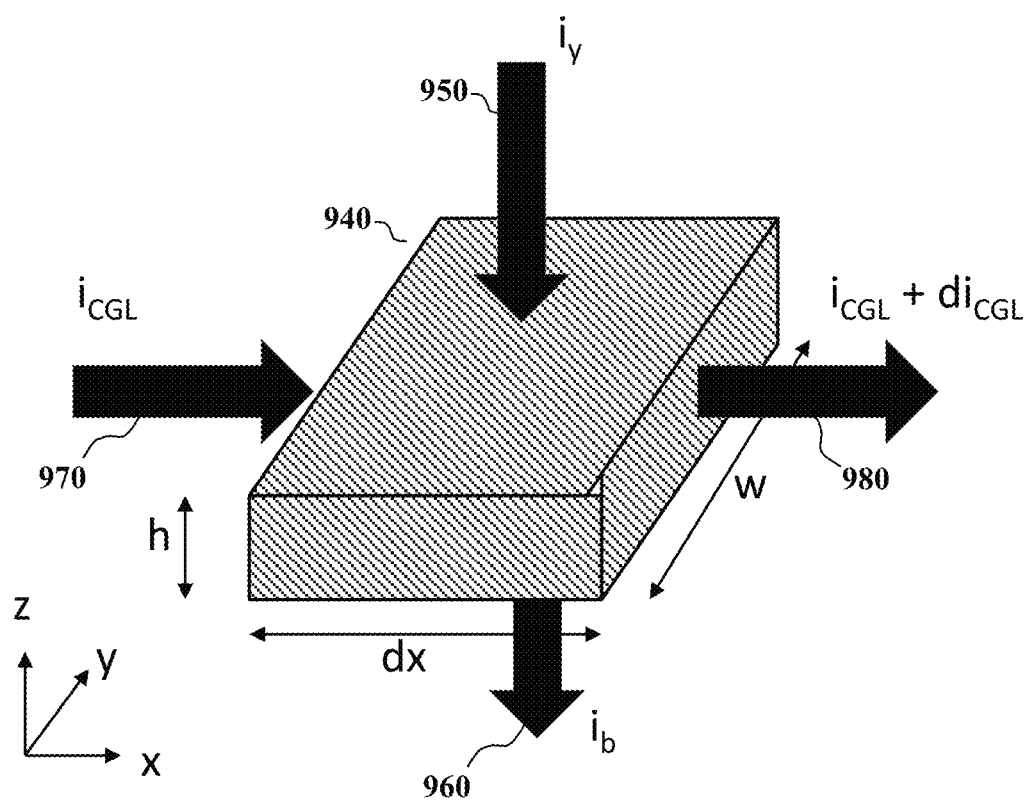
FIG. 10 shows the current balance in a differential portion of the charge-generating layer of this invention.

Turning now to FIG. 10, there is shown a differential portion 940 of charge-generating layer 140. Charge-generating layer portion 940 is has a width w (in the y dimension) and thickness h (in the z dimension), and has a length dx in the x dimension. Current density 950 is the vertical current $i_y$ passing through second organic light-emitting unit 150 (from the cathode), and current density 960 is the vertical current $i_b$ passing through first organic light-emitting unit 130 (toward the anode). There is also a current $i_{CGL}$ that passes laterally through portion 940, toward the anode at the charge-generating layer/anode connection, or CGL/anode junction. Lateral current density 970 is the current arriving at portion 940 from the next furthest differential portion, and lateral current density 980 is the current that leaves portion 940 toward the next differential portion. As current density 980 is closer to the CGL/anode junction, which has a higher potential, current density 980 is increased by a small amount $di_{CGL}$ relative to current density 970. The total of currents passing through portion 940 must sum to zero, so current density 960 must be decreased by an amount $di_{CGL}$ relative to current density 950. Considering the current densities and areas of portion 940 in the respective current direction gives:

$$(i_y - i_b)w\,dx = wh\,di_{CGL} \quad (5)$$

which can be rearranged as:

$$(i_y - i_b) = h\frac{di_{CGL}}{dx} \quad (6)$$

The rate of change of voltage with position in the x-dimension in charge-generating layer 140 with resistivity ρ is:

$$\frac{dv_{CGL}}{dx} = \rho i_{CGL} \quad (7)$$

Combining equations (6) and (7) and using $$R_s = \frac{\rho}{h}$$

for the sheet resistance gives the following, which was also Equation (1) above:

$$(i_y - i_b)R_s = \frac{d^2 v_{CGL}}{dx^2} \quad (8)$$

Charge-generating layer 140 is connected to the anode at the x=0 end. As disclosed above, the 2-point boundary conditions are:

$$v_{CGL} = v_{Anode} \text{ at } x = 0 \text{(the anode contact end)} \quad (9)$$

$$\frac{dv_{CGL}}{dx} = 0 \text{ at } x = 1 \text{(the cathode contact end)} \quad (10)$$

The lateral current $i_{CGL}$ flowing through charge-generating layer 140 will result in power consumption not used for generating light. Too large of a power loss will make the device undesirable. The power lost due to lateral current flow will be the sum over all the differential strips of (current) X (voltage drop for the strip), or:

$$P_{loss\ in\ CGL} = \Sigma_{x=0}^{x=l} wh\,i_{CGL}\,dv_{CGL} \quad (11)$$

Converting to the integral and using equation (5) to replace $i_{CGL}$ gives:

$$P_{loss\,in\,CGL} = \int_{x=0}^{x=l} \frac{wh}{\rho} \frac{dv_{CGL}}{dx} dv_{CGL} = \frac{w}{R_s} \int_0^l \left[\frac{dv_{CGL}}{dx}\right]^2 dx \quad (12)$$

The power lost (per unit width normal to x) is the following, which was also Equation (3) above:

$$P_{loss\,in\,CGL} = \frac{1}{R_s} \int_0^l \left[\frac{dv_{CGL}}{dx}\right]^2 dx \quad (13)$$

While the principles of the disclosure have been illustrated in relation to the exemplary embodiments shown herein, the principles of the disclosure are not limited thereto and include any modification, variation, or permutation thereof.

What is claimed is:

1. A color-tunable OLED device comprising:
   a. a charge-carrying cathode layer and a charge-carrying anode layer disposed parallel to each other;
   b. at least a first organic light-emitting unit and a second organic light-emitting unit disposed between the charge-carrying cathode layer and the charge-carrying anode layer; and
   c. at least one charge-generating layer disposed between the charge-carrying cathode layer and the charge-carrying anode layer, wherein the charge-generating layer is a charge-carrying layer of lesser lateral conductivity than the charge-carrying anode layer and the charge-carrying cathode layer, and said charge-generating layer is electrically connected without additional circuit elements to another charge-carrying layer and disposed such that at least the first organic light-emitting unit or the second organic light-emitting unit is wedged between the electrically connected charge-generating layer and the another charge-carrying layer, and at least the first organic light-emitting unit or the second organic light-emitting unit is not wedged between the electrically connected charge-generating layer and the another charge-carrying layer,
   wherein the another charge-carrying layer is the charge-carrying cathode layer or the charge-carrying anode layer.

2. The color-tunable OLED device of claim 1 wherein the lateral conductivity of the charge-generating layer is greater than a lateral conductivity of the first and second organic light-emitting units.

3. The color-tunable OLED device of claim 2 wherein a resistivity of the charge-generating layer is in a range from 100 to 3000 ohms/square.

4. The color-tunable OLED device of claim 3 wherein the lateral conductivity of the charge-generating layer is consistent with a first characteristic that, at a first light-producing voltage, a lateral voltage change across the charge-generating layer is less than or equal to a practical threshold voltage of the wedged organic light-emitting unit, such that vertical current substantially only flows through, and light is substantially only emitted by, the non-wedged organic light-emitting unit.

5. The color-tunable OLED device of claim 4 wherein the lateral conductivity of the charge-generating layer is consistent with a second characteristic that, at a second light-producing voltage greater than the first light-producing voltage, a lateral voltage change across the charge-generating layer is greater than the practical threshold voltage of the wedged organic light-emitting unit, such that vertical current flows through, and light is emitted by, at least a portion of the wedged organic light-emitting unit.

6. The color-tunable OLED device of claim 1 wherein the charge-generating layer comprises a metal, a metal oxide, or a conductive doping material in a less conductive material.

7. The color-tunable OLED device of claim 6 wherein the charge-generating layer comprises silver, calcium, indium-tin oxide, zinc oxide, or molybdenum oxide.

8. The color-tunable OLED device of claim 6 wherein the conductivity of the charge generating layer varies based on a thickness of the layer, or a percentage of conductive doping material, or both.

9. The color-tunable OLED device of claim 1 wherein the device is connected to and controlled by a control circuit that includes a variable voltage source.

10. The color-tunable OLED device of claim 9 wherein the control circuit further includes a pulse-width modulating unit.

11. The color-tunable OLED device of claim 1 wherein the first organic light-emitting unit provides light in a selected first portion of the visible spectrum, and the second organic light-emitting unit provides light in a selected second portion of the visible spectrum.

12. The color-tunable OLED device of claim 11 wherein the selected first portion of the visible spectrum and the selected second portion of the visible spectrum are complementary colors that together can produce white light.

13. The color-tunable OLED device of claim 1 further including a third light-emitting unit and a second charge-generating layer disposed between the charge-carrying cathode layer and the charge-carrying anode layer.

14. The color-tunable OLED device of claim 13 wherein the charge-generating layer is electrically connected to the second charge-generating layer, and neither the charge-generating layer nor the second charge-generating layer is electrically connected to the charge-carrying cathode layer or the charge-carrying anode layer.

15. The color-tunable OLED device of claim 13 wherein the charge-generating layer is electrically connected to the second charge-generating layer and to the charge-carrying cathode layer or the charge-carrying anode layer.

16. The color-tunable OLED device of claim 13 wherein the charge-generating layer is electrically connected to the charge-carrying cathode layer on the charge-carrying anode layer, and the second charge-generating layer is not connected to the another charge-carrying layer.

17. The color-tunable OLED device of claim 13 wherein the charge-generating layer is electrically connected to one of the charge-carrying cathode layer and the charge-carrying anode layer, and the second charge-generating layer is connected to the charge-carrying cathode layer or the charge-carrying anode layer, whichever is other than the one of the charge-carrying cathode layer and the charge-carrying anode layer.

18. The color-tunable OLED device of claim 13 wherein a lateral conductivity of the second charge-generating layer is different from the lateral conductivity of the charge-generating layer.

19. The color-tunable OLED device of claim 13 wherein the first organic light-emitting unit provides light in a selected first portion of the visible spectrum, the second organic light-emitting unit provides light in a selected second portion of the visible spectrum, and the third organic light-emitting unit provides light in a selected third portion of the visible spectrum.

20. The color-tunable OLED device of claim 19 wherein the selected portions of the visible spectrum are complementary colors that together can produce white light.

21. The color-tunable OLED device of claim 13 wherein the first and third organic light-emitting units provide light in a selected first portion of the visible spectrum, and the second organic light-emitting unit provides light in a selected second portion of the visible spectrum.

22. The color-tunable OLED device of claim 21 wherein the selected first portion of the visible spectrum and the selected second portion of the visible spectrum are complementary colors that together can produce white light.

23. The color-tunable OLED device of claim 13 wherein the charge-carrying cathode layer and the charge-carrying anode layer are electrodes, wherein the charge-generating layer and the second charge-generating layer are charge-generating layers, and wherein light emissions for the first, second, and third organic light-emitting units have different areas, as defined by overlap of the electrodes and the charge-generating layers.

24. The color-tunable OLED device of claim 1 wherein the electrical connection of the charge-generating layer to the another charge-carrying layer is located a selected distance outside of an emitting area of the device.

25. The color-tunable OLED device of claim 1 wherein the charge-carrying cathode layer and the charge-carrying anode layer are electrodes, and wherein light emissions for the first and second organic light-emitting units have different areas, as defined by overlap of the electrodes and the charge-generating layer.

26. The color-tunable OLED device of claim 1 further including a diffuser on a light-emitting side of the device.

* * * * *

UNITED STATES PATENT AND TRADEMARK OFFICE
CERTIFICATE OF CORRECTION

PATENT NO. : 9,142,595 B2
APPLICATION NO. : 14/056943
DATED : September 22, 2015
INVENTOR(S) : John W. Hamer Page 1 of 1

It is certified that error appears in the above-identified patent and that said Letters Patent is hereby corrected as shown below:

In the Claims,

Claim 16, at col. 24, line 49, "cathode layer on the charge-carrying" should read as follows
--cathode layer or the charge-carrying--

Signed and Sealed this
Twelfth Day of July, 2016

Michelle K. Lee
*Director of the United States Patent and Trademark Office*